(12) United States Patent
Sato

(10) Patent No.: US 9,887,253 B2
(45) Date of Patent: Feb. 6, 2018

(54) LIGHT EMITTING ELEMENT DISPLAY DEVICE

(71) Applicant: Japan Display Inc., Tokyo (JP)

(72) Inventor: Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/950,897

(22) Filed: Nov. 24, 2015

(65) Prior Publication Data

US 2016/0087021 A1    Mar. 24, 2016

Related U.S. Application Data

(63) Continuation-in-part of application No. 14/602,909, filed on Jan. 22, 2015.

(30) Foreign Application Priority Data

Jan. 27, 2014  (JP) .................................. 2014-012823

(51) Int. Cl.
| | |
|---|---|
| H01L 27/32 | (2006.01) |
| H01L 29/66 | (2006.01) |
| H01L 29/04 | (2006.01) |
| H01L 29/16 | (2006.01) |
| H01L 29/786 | (2006.01) |
| H01L 29/24 | (2006.01) |

(52) U.S. Cl.
CPC ...... *H01L 27/3262* (2013.01); *H01L 27/3265* (2013.01); *H01L 27/3272* (2013.01); *H01L 29/04* (2013.01); *H01L 29/16* (2013.01); *H01L 29/24* (2013.01); *H01L 29/66757* (2013.01); *H01L 29/66969* (2013.01); *H01L 29/7869* (2013.01); *H01L 29/78675* (2013.01); *H01L 27/3276* (2013.01)

(58) Field of Classification Search
None
See application file for complete search history.

(56) References Cited

U.S. PATENT DOCUMENTS

| | | | |
|---|---|---|---|
| 7,507,998 B2 | 3/2009 | Tseng | |
| 2002/0140343 A1 | 10/2002 | Hirabayashi | |
| 2008/0079005 A1* | 4/2008 | Tseng | H01L 27/1255 257/72 |
| 2010/0182223 A1 | 7/2010 | Choi et al. | |

(Continued)

FOREIGN PATENT DOCUMENTS

| | | |
|---|---|---|
| JP | 2002-352955 A | 12/2002 |
| JP | 2012-160679 A | 8/2012 |
| JP | 2013-054161 A | 3/2013 |

OTHER PUBLICATIONS

Office Action dated no Jan. 14, 2016, for U.S. Appl. No. 14/602,909 which is a parent of this application.

(Continued)

*Primary Examiner* — Su C Kim
*Assistant Examiner* — David S Wilbert
(74) *Attorney, Agent, or Firm* — Typha IP LLC

(57) ABSTRACT

A display device includes two or more transistors in one pixel, and the two or more transistors include a first transistor of which a channel semiconductor layer is polycrystalline silicon, and a second transistor of which a channel semiconductor layer is an oxide semiconductor.

3 Claims, 43 Drawing Sheets

(56) References Cited

U.S. PATENT DOCUMENTS

| | | | |
|---|---|---|---|
| 2011/0115839 A1* | 5/2011 | Takahashi | H01L 27/1225 345/698 |
| 2013/0044095 A1 | 2/2013 | Heo et al. | |
| 2014/0061606 A1* | 3/2014 | Kim | H01L 23/48 257/40 |
| 2014/0077180 A1* | 3/2014 | Moon | H01L 51/5296 257/40 |
| 2014/0077184 A1 | 3/2014 | Im et al. | |
| 2014/0110678 A1 | 4/2014 | Jin et al. | |
| 2014/0131666 A1 | 5/2014 | Song et al. | |
| 2015/0053935 A1 | 2/2015 | Gupta et al. | |
| 2015/0055051 A1* | 2/2015 | Osawa | H01L 27/1225 349/48 |

OTHER PUBLICATIONS

Shinya Ono, Koichi Miwa, Yuichi Maekawa, and Takatoshi Tsujimura, "VT compensation circuit for AM OLED displays compossed of two TFTs and one capacitor," IEEE trans. Elect. Devices, vol. 54, No. 3, Mar. 2007, p. 462-467.

* cited by examiner

LIGHT EMITTING ELEMENT DISPLAY DEVICE

CROSS-REFERENCE TO RELATED APPLICATION

This application is a continuation-in-part of U.S. patent application Ser. No. 14/602,909, filed on Jan. 22, 2015, which claims priority from Japanese application JP 2014-012823 filed on Jan. 27, 2014, the entire contents of which are hereby incorporated by reference into this application.

BACKGROUND OF THE INVENTION

1. Field of the Invention

The present invention relates to a light emitting element display device.

2. Description of the Related Art

In recent years, light emitting element display devices using self-luminous bodies such as organic light emitting diodes (OLED) have been put into practical use. As compared with the related art liquid crystal display device, because the light emitting element display devices including an organic EL (Electroluminescent) display device using the OLED use the self-luminous bodies, the light emitting element display device not only is excellent in visibility and response speed, but also requires no auxiliary lighting device such as backlight, and therefore can be further thinned.

JP 2002-352955 A discloses a display device having the light emitting elements in which a drive element is formed below a bank, and a lower light shielding film having conductivity is formed below the drive element, to thereby prevent a leakage current, and form a bank layer by self-alignment.

In the organic EL display device, in recent years, high definition progresses, to thereby reduce the size of each pixel. The organic EL display device allows a current to flow by retaining a potential difference corresponding to a gradation value in each pixel. However, a reduction in the size of pixels causes electrodes to be also reduced in size, as a result of which a capacity for retaining the potential difference is reduced. If the capacity for retaining the potential difference is small, the potential difference changes due to an influence of noise or an influence of slight leakage, and brightness of the respective pixels is varied. As a result, it is conceivable that the display quality is degraded.

Recently, a demand for high definition and lower power consumption has been strongly required in a light emitting display device for mobile usage. As a display device for mobile usage, for example, a liquid crystal display device (LCD), a display device that uses a self-light emitting element (an organic light emitting diode (OLED)) such as an organic EL display device, and electronic paper are employed.

Among these, for the purpose of realizing a flat-screen and high brightness, and high speed of a display panel, the organic EL display device has been developed. The organic EL display device is a display device which is provided with a pixel formed of the OLED, and has no mechanical operation and thus has fast reaction rate. In addition, in the organic EL display device, light is emitted from each pixel, and the back light source is not necessary, and thus it is possible to perform high brightness display, and to realize the flat-screen. For this reason, the organic EL display device is expected as a next generation display device in place of the liquid crystal.

Particularly, in a small and medium-sized organic EL display device, high definition of a display unit has been required. When the high definition of the display device progresses, a pixel size is reduced, and thus it is necessary to reduce the sizes of a plurality of TFTs which form a pixel circuit, or a capacitor, that is, the size of a capacitor for supplying a current which corresponds to the size of a video signal to an OLED, a thin film transistor (TFT) for writing the video signal into the capacitor, a TFT for supplying the current which corresponds to an electric charge of the capacitor to the OLED from a power line, or the like. In the TFT which writes the video signal into the capacitor, there is a problem in that the variation of the video signal is increased due to leakage currents, unnecessary charges, and the like when retaining the video signal and thus the display unevenness occurs. In addition, the TFT for supplying the current to the OLED is required to have large driving performance; however, an area size is reduced. Further, it is required to reduce characteristic variation due to the application of the current.

In this regards, JP 2013-54161 A discloses a technique relating to a driving method of suppressing display unevenness caused by potential setting timing. However, in a full high definition smart phone, and the like, when high definition progresses through a control method disclosed in JP 2013-54161 A, characteristics of a transistor which writes a video signal into a capacitor are varied, thereby adversely affecting the image quality. In addition, the driving performance of the TFT is not sufficient to supply a current to an OLED.

Further, for example, JP 2012-160679 A discloses a technique relating to a display device that uses a thin film transistor of which a channel is formed on an oxide semiconductor layer. However, in a case where the TFT of which the channel is formed on the oxide semiconductor layer is used as a driving element for supplying a current to an OLED, there is a problem in that an operating point is greatly varied over time.

In addition, US 2015/0055051 A, US 2015/0053935 A, and US 2010/0182223 A disclose examples that in the organic EL display device, in a driving transistor for controlling a current which flows into an organic light emitting element, an oxide semiconductor layer is used as a channel, and in a switch transistor for controlling whether or not a gradation voltage is applied with respect to a capacitance for retaining a gate voltage of a driving transistor, a polycrystalline semiconductor layer is used as a channel. However, a leakage current amount of the transistor in which the polycrystalline semiconductor layer is used as the channel is larger than that of the transistor in which the oxide semiconductor layer is used as the channel, and thus the charge may leak from the capacitance for retaining the gate voltage of the driving transistor. Further, the current greater than that in the switch transistor flows into the driving transistor, but the transistor in which the oxide semiconductor layer is used as the channel has mobility lower than that of the transistor in which the polycrystalline semiconductor layer is used as the channel, and is required to have an area larger than that of the transistor in which the polycrystalline semiconductor layer is used as the channel when the same amount of currents flows at the same voltage between the gate sources.

SUMMARY OF THE INVENTION

The present invention has been made in view of the above-mentioned circumstances, and therefore an object of the present invention is to provide an organic EL display device that is high in display quality even if high definition progresses.

According to a second aspect, an object of the invention is to provide a pixel circuit and a display device which are excellent in electric characteristics, and realize a high-quality operation of a high-definition pixel.

According to the present invention, there is provided a light emitting element display device including light emitting elements that emit light by allowing a current to flow in a plurality of pixels arranged in a display area in a matrix, and at least two transistors that are arranged in each of the plurality of pixels, and control the current flowing in the light emitting elements, in which semiconductor portions of the at least two transistors are formed in layers different from each other. In the present specification, "layers different from each other" means layers not formed at the same time. Also, "pixel" means a unit having the light emitting element, and means a sub-pixel if the pixel is configured by plural light emitting elements to have plural sub-pixels.

Also, in the light emitting element display device according to the present invention, the at least two transistors may include a pixel transistor that controls the application of a voltage corresponding to a gradation value, and a drive transistor that controls light emission on the basis of a potential applied through the pixel transistor, a first layer having the semiconductor portion of the drive transistor may further include a first capacitor electrode made of a conductor, a second layer having the semiconductor portion of the pixel transistor may further include a second capacitor electrode that is continuous to the semiconductor portion of the pixel transistor, and made of a conductor forming a gate of the drive transistor, and the first capacitor electrode and the second capacitor electrode may overlap with each other through an insulating layer.

In the present specification, the first layer and the second layer may be formed of one layer formed at the same time, or may be formed of a set of plural layers including plural layers formed at the same time, for example, the combination of a layer of a semiconductor with a layer of source/drain. However, as described above, the semiconductor portions are required to be layers not formed at the same time.

Also, in the light emitting element display device according to the present invention, a third layer having scanning signal lines which are gates of the pixel transistors may further include a third capacitor electrode that is electrically independent from the scanning signal lines, electrically connected to the first capacitor electrode through a contact hole, and arranged to sandwich the second capacitor electrode in cooperation with the first capacitor electrode through an insulating layer.

Also, in the light emitting element display device according to the present invention, the first capacitor electrode may be electrically independent from the semiconductor portion of the drive transistor, and electrically connected to a reference potential.

Also, in the light emitting element display device according to the present invention, the first capacitor electrode may be continuous to the semiconductor portion of the drive transistor, and electrically connected to one of a source and a drain of the drive transistor made of a conductor.

Also, in the light emitting element display device according to the present invention, the second capacitor electrode and the third capacitor electrode may be formed to overlap with a reference potential line connected to a reference potential in a plan view.

Also, in the light emitting element display device according to the present invention, the first layer and the second layer may be made of polysilicon.

According to an embodiment of the second aspect in the invention, there is provided a display device including two or more transistors in one pixel, in which the two or more transistors include a first transistor of which a channel semiconductor layer is polycrystalline silicon and a second transistor of which a channel semiconductor layer is an oxide semiconductor.

In addition, the pixel may include a capacitor, a gate potential of the first transistor may be retained by the capacitor, and the second transistor may apply a potential in response to a video signal to the capacitor.

In addition, the channel semiconductor layer of the first transistor and the channel semiconductor layer of the second transistor may be provided on different insulating layers.

Further, the display device may further include a first insulating layer; a second insulating layer which is provided on the first insulating layer; a third insulating layer which is provided on the second insulating layer; a first electrode layer which is provided on the first insulating layer, and is not electrically connected to a source or a drain of the first transistor; a second electrode layer which is provided on the second insulating layer, and is electrically connected to a source or a drain of the second transistor; and a third electrode layer which is provided on the third insulating layer, and is electrically connected to the first electrode layer, in which the channel semiconductor layer of the first transistor is provided on the first insulating layer, the channel semiconductor layer of the second transistor is provided on the second insulating layer, and the capacitor is provided in an area in which the first electrode layer and the second electrode layer overlap with each other with the second insulating layer interposed therebetween, and an area in which the second electrode layer and the third electrode layer overlap with each other with the third insulating layer interposed therebetween.

In addition, the pixel may include a power line, the power line may be provided on the insulating layer which is different from the first electrode layer, the second electrode layer, and the third electrode layer, and the capacitor and the power line have an area in which the capacitor and the power line overlap with each other.

In addition, the pixel may include a signal line, the signal line may be provided on the insulating layer which is different from the first electrode layer, the second electrode layer, and the third electrode layer, and the capacitor and the signal line have an area in which the capacitor and the signal line overlap with each other.

Further, the channel semiconductor layer of the first transistor and the channel semiconductor layer of the second transistor may be provided on the same insulating layer.

According to the second aspect of the invention, there is provided a method of manufacturing a display device including forming a first insulating layer on a TFT substrate; forming a first transistor of which a channel semiconductor layer is polycrystalline silicon on the first insulating layer; forming a second insulating layer on the first insulating layer and the first transistor; and forming a second transistor of which a channel semiconductor layer is an oxide semiconductor on the second insulating layer.

In addition, the method of manufacturing a display device may further include forming a first electrode layer which is not electrically connected to a source or a drain of the first transistor on the first insulating layer; forming a second electrode layer which is electrically connected to a source or a drain of the second transistor on the second insulating layer; forming a third insulating layer on the second insulating layer, the second transistor, and the second electrode layer; forming a via for electrically connecting the first electrode layer to the third insulating layer and the second insulating layer; forming a third electrode layer which is electrically connected to the first electrode layer through the via on the third insulating layer; and forming a capacitor on an area in which the first electrode layer and the second electrode layer overlap with each other with the second insulating layer interposed therebetween, and an area in which the second electrode layer and the third electrode layer overlap with each other with the third insulating layer interposed therebetween.

Further, the method of manufacturing a display device may further include forming a fourth insulating layer on the third insulating layer and the third electrode layer; and forming a power line on the fourth insulating layer, in which the power line and the capacitor have an area in which the power line and the capacitor overlap with each other with the fourth insulating layer interposed therebetween.

In addition, the method of manufacturing a display device may further include forming a signal line on the fourth insulating layer, in which the signal line and the capacitor have an area in which the signal line and the capacitor overlap with each other with the fourth insulating layer interposed therebetween.

According to an embodiment of the second aspect in the invention, a method of manufacturing a display device including forming an insulating layer on a TFT substrate; and forming a first transistor of which a channel semiconductor layer is polycrystalline silicon on the insulating layer, and then forming a second transistor of which a channel semiconductor layer is an oxide semiconductor on the insulating layer.

DETAILED DESCRIPTION OF THE INVENTION

Figure 1:
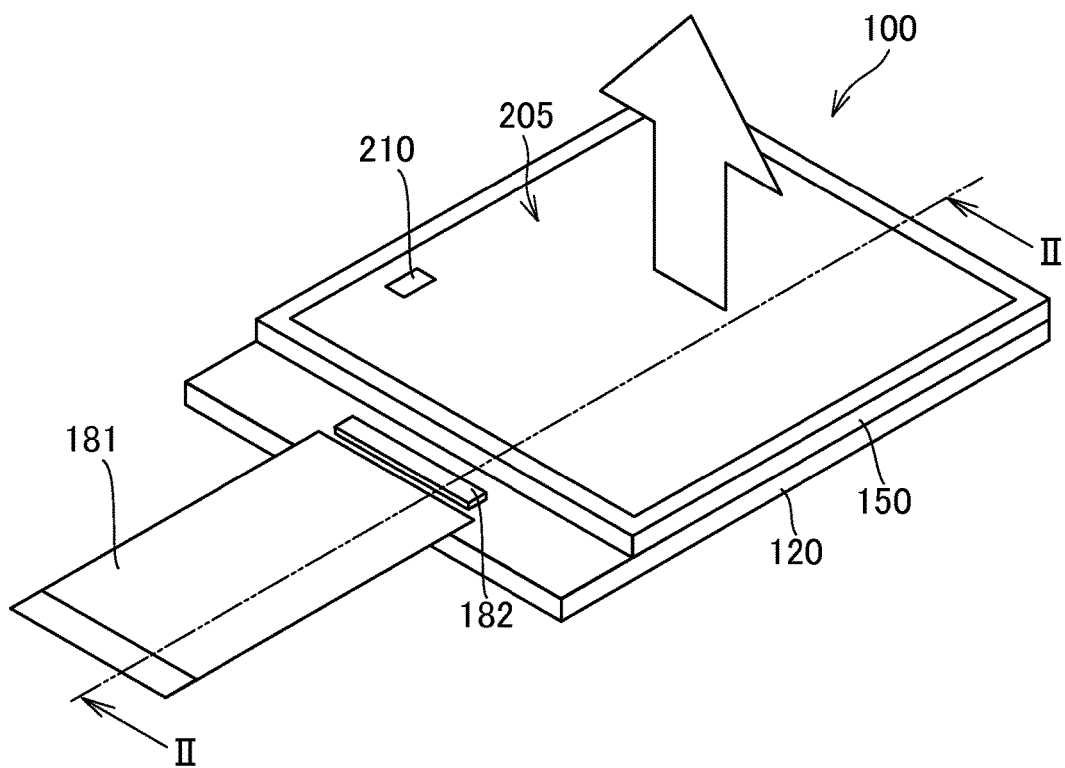
FIG. 1 is a diagram schematically illustrating an organic EL display device according to an embodiment of the present invention.

Hereinafter, the respective embodiments of the present invention will be described with reference to the accompanying drawings. The disclosure is merely exemplary, and appropriate changes that could be easily conceived by those skilled in the art without departing from the spirit of the present invention are naturally included within the scope of the present invention. Also, in the drawings, for more clarification of the illustration, as compared with actual embodiments, widths, thicknesses, and shapes of respective parts may be schematically illustrated, but may be merely exemplary, and do not limit the interpretation of the present invention. Also, in the present specification, and the respective drawings, the same elements as those described in the foregoing drawings are denoted by identical symbols, and their detailed description will be appropriately omitted.

FIG. 1 schematically illustrates an organic EL display device 100 that is a light emitting element display device according to an embodiment of the present invention. As illustrated in FIG. 1, the organic EL display device 100 has two substrates of a TFT (thin film transistor) substrate 120 and a counter substrate 150, and a filler 221 (refer to FIG. 2) made of transparent resin is sealed between those substrates. A display area 205 having pixels 210 arranged in a matrix is formed in the TFT substrate 120 and the counter substrate 150 of the organic EL display device 100. In this example, each of the pixels 210 is configured by plural sub-pixels 212 (to be described later).

Also, the TFT substrate 120 is formed of a substrate made of an insulating material of transparent glass or resin, and a drive IC (integrated circuit) 182 is mounted on the TFT substrate 120. The drive IC 182 is a drive circuit that applies a potential for conducting between a source and a drain to scanning signal lines 342 of pixel transistors 220 (to be described later) arranged in the respective sub-pixels 212, and also applies a voltage corresponding to a gradation value of the sub-pixels 212 to image signal lines 312 (to be described later). Also, an FPC (flexible printed circuits) 181 for inputting an image signal from the external is fitted to the TFT substrate 120. Also, in this embodiment, a top emission type organic EL display device that emits light to a side where a light emitting layer of the TFT substrate 120 is formed as indicated by an arrow in FIG. 1 is provided.

Figure 2:
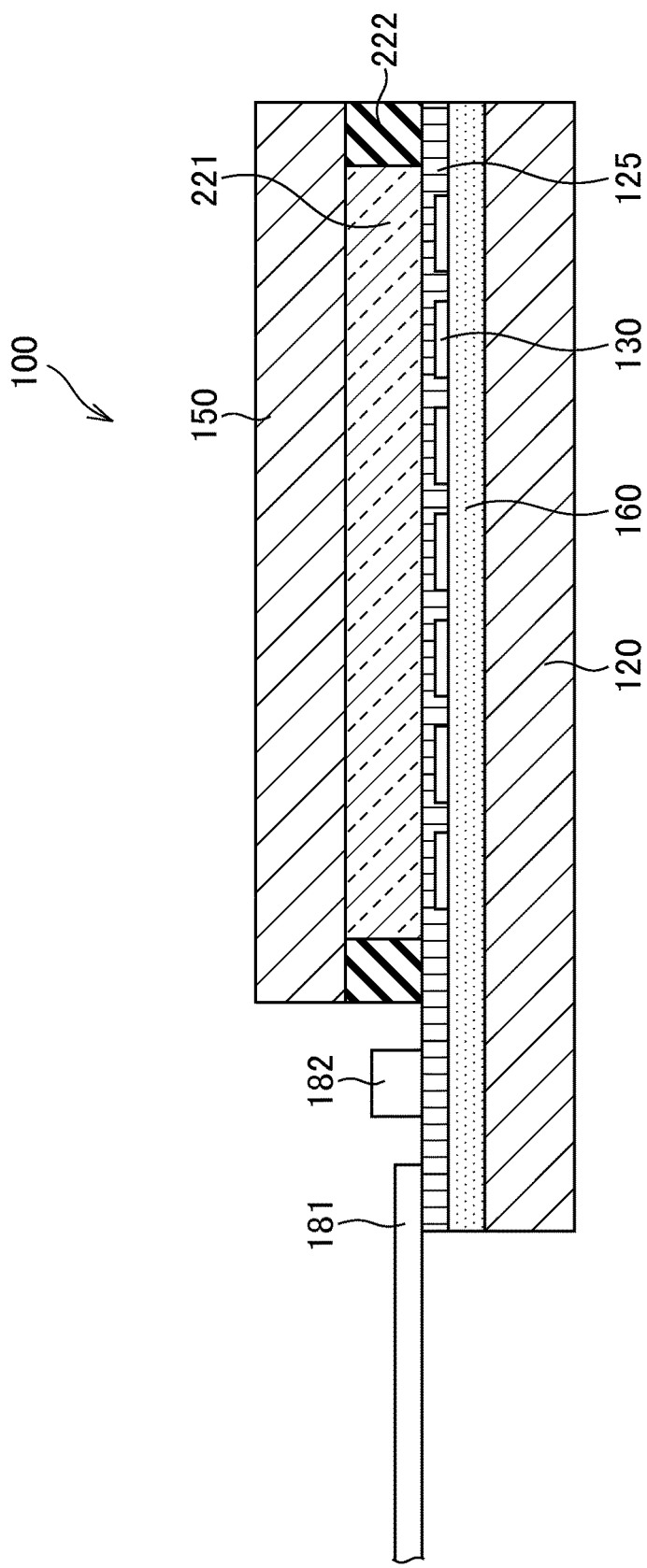
FIG. 2 is a schematic cross-sectional view taken along a line II-II of FIG. 1.

FIG. 2 is a schematic cross-sectional view taken along a line II-II of FIG. 1. As indicated in the cross-sectional view, a TFT circuit layer 160 in which TFT circuits are formed, plural organic EL elements 130 which are plural light emitting elements formed on the TFT circuit layer 160, and a sealing film 125 that covers the organic EL elements 130, and blocks moisture are formed over the TFT substrate 120. The organic EL elements 130 are formed by the number of sub-pixels 212 included in each of the pixels 210. However, for easily understanding the illustration, FIG. 2 is simplified. Also, color filters that transmit light of wavelength regions different from each other of, for example, three colors or four colors, and a black matrix which is a light shielding film that shields the light emitted from boundaries of the respective sub-pixels 212 are formed on the counter substrate 150. The filler 221 between the TFT substrate 120 and the counter substrate 150 is sealed with a sealant 222.

Figure 3:
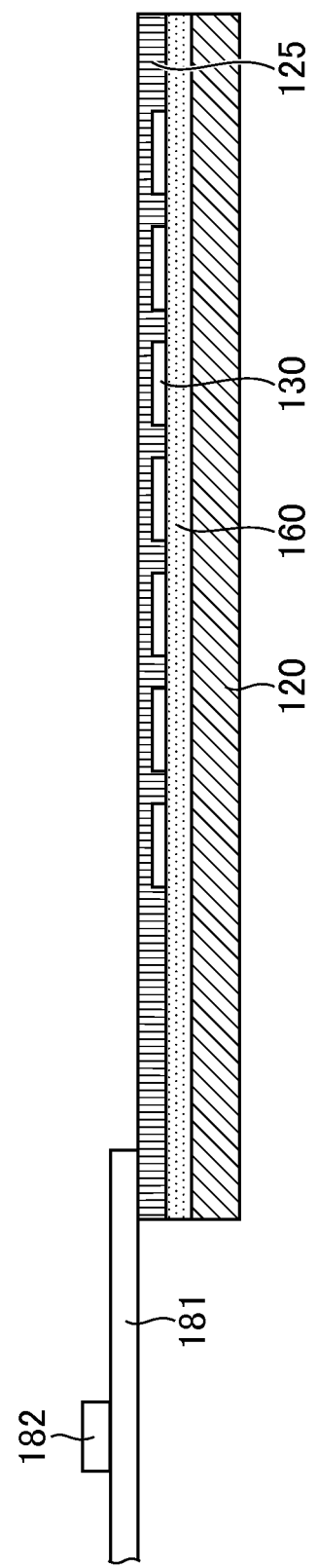
FIG. 3 is a diagram illustrating an example of an organic EL display device having no counter substrate.

In this embodiment, a configuration having the counter substrate 150 is provided as illustrated in FIG. 2. Alternatively, a configuration having no counter substrate 150 is provided as illustrated in FIG. 3. Also, as illustrated in FIG. 3, the drive IC 182 may be arranged on the FPC 181. In particular, if the TFT substrate 120 is made of a flexible resin material, the TFT substrate 120 may be integrated with the FPC 181. Also, in this embodiment, the organic EL elements 130 emit light of white, and transmit the light having the wavelength regions of three colors or four colors using a color filter. Alternatively, the organic EL elements 130 emit the light having the wavelength regions different from each other of, for example, three colors or four colors.

Figure 4:
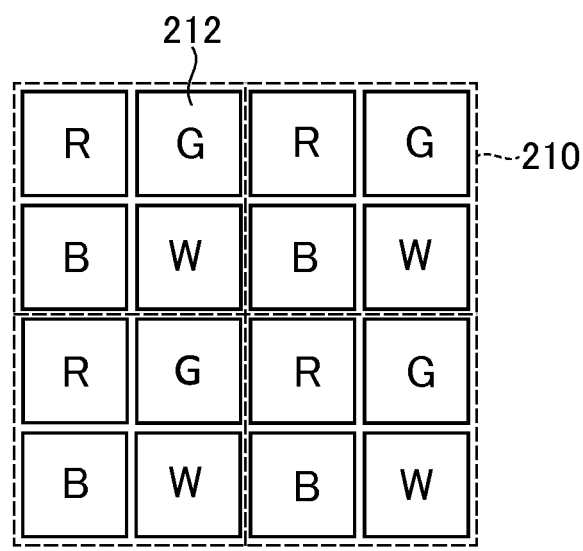
FIG. 4 is a diagram illustrating a configuration example of sub-pixels included in each of pixels in FIG. 1.
Figure 5:
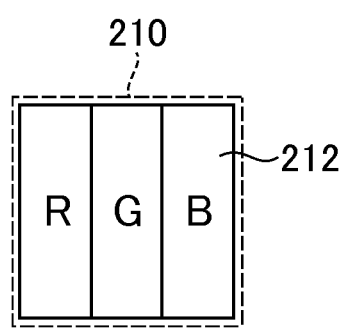
FIG. 5 is a diagram illustrating a configuration example of the sub-pixels included in each of the pixels in FIG. 1.

FIG. 4 is a diagram illustrating a configuration example of the sub-pixels 212 included in each of the pixels 210 in FIG. 1. As illustrated in FIG. 4, each of the pixels 210 includes substantially rectangular sub-pixels 212 that emit the light of the wavelength regions corresponding to four kinds of colors of R (red), G (green), B (blue), and W (white), and the sub-pixels 212 are aligned in squares in such a manner that two sides of each sub-pixel 212 come in contact with the other sub-pixels 212 within the same pixel 210. The configuration of the sub-pixels 212 in each of the pixels 210 is not limited to the configuration in FIG. 4, but may be a stripe configuration including the sub-pixels 212 corresponding to three colors of RGB as illustrated in FIG. 5, or a stripe configuration using four kinds of colors of RGBW. The arrangement of the sub-pixels 212 configuring the pixels 210 is not limited to those configurations, but may be appropriately determined.

Figure 6:
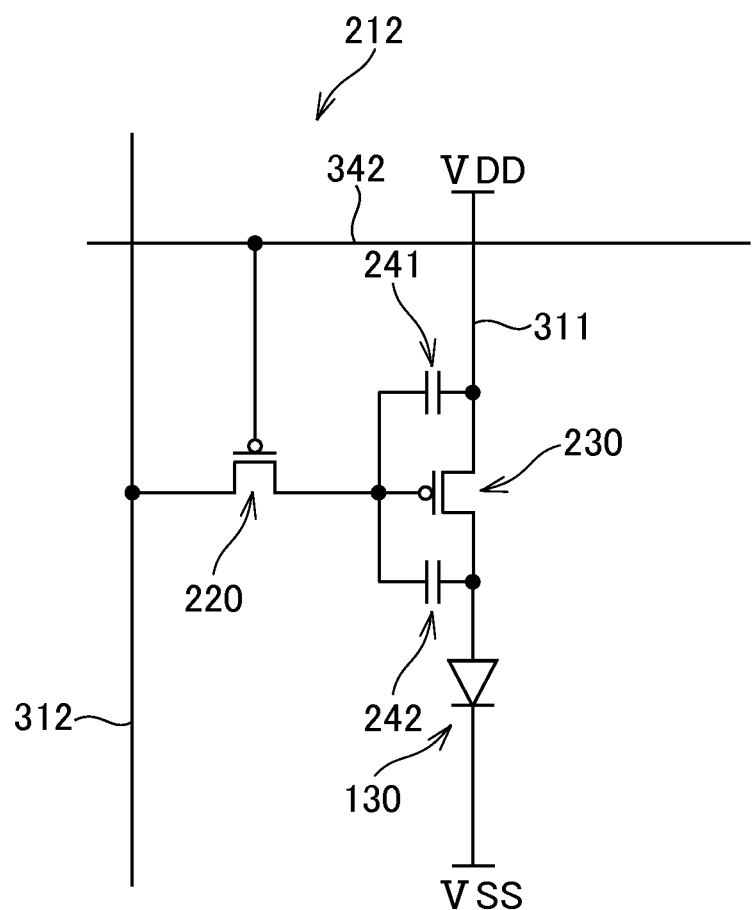
FIG. 6 is a circuit diagram illustrating an example of a circuit in each of the sub-pixels.

FIG. 6 is a circuit diagram illustrating an example of a circuit in each of the sub-pixels 212. The operation of the circuit for emitting light will be described with reference to FIG. 6. An image signal corresponding to a gradation value of each sub-pixel 212 is supplied to each of the image signal lines 312, and the pixel transistor 220 is rendered conductive on the basis of the signal of the scanning signal line 342, as a result of which a voltage based on the gradation value is stored in a capacitor 241 and/or 242. The organic EL elements 130 emit light by allowing a drive transistor 230 to flow a current based on the potential stored in the capacitor 241 and/or 242. A cathode side of the organic EL element 130 is connected to a low reference potential VSS, and a source side (side opposite to the organic EL elements 130 side) of the drive transistor 230 is connected to a high reference potential line 311 retained to a high reference potential VDD.

In this example, both of the respective capacitors 241 and 242 may be formed, or any one capacitor may be formed. In this circuit diagram, a p-type semiconductor is used, but an n-type semiconductor may be used. Also, the circuit of FIG. 6 is a simple circuit for describing the control of light emission, and has two transistors. Alternatively, the circuit may be configured to have three or more transistors, or may include the other control lines or capacitors. Thus, the configuration of the circuit can be arbitrarily determined.

Figure 7:
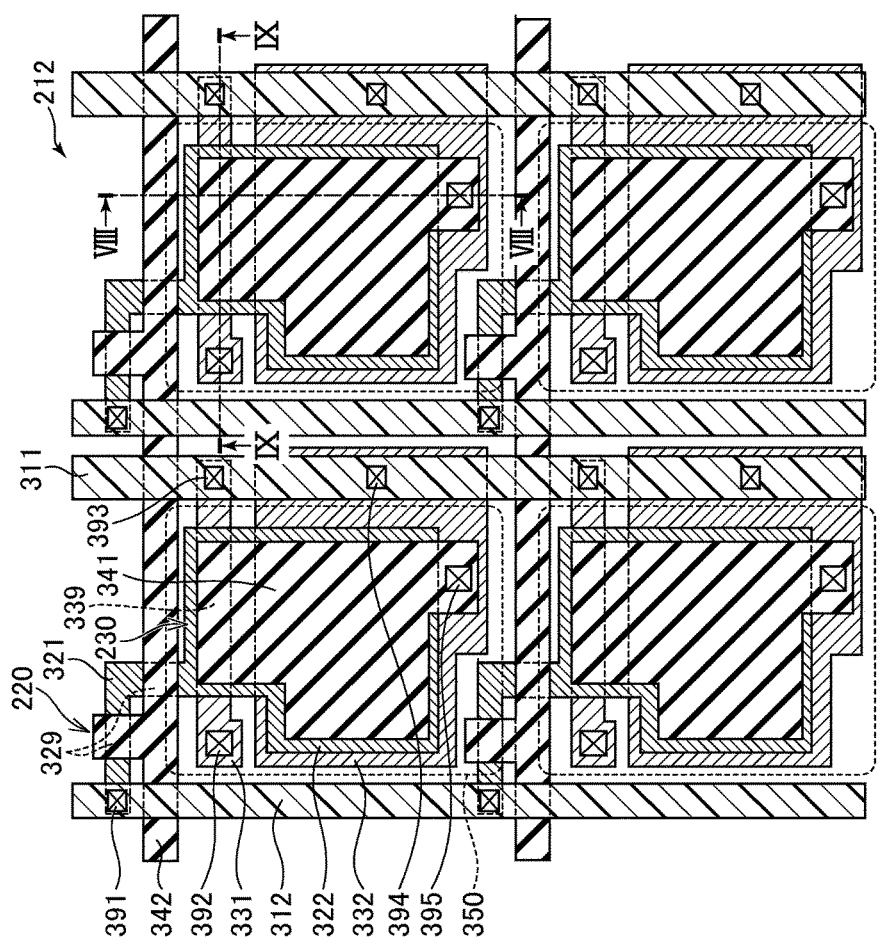
FIG. 7 is a diagram schematically illustrating a layout of lines and electrodes configuring the circuit of FIG. 6.

FIG. 7 is a diagram schematically illustrating a layout of the lines and the electrodes configuring the circuit of FIG. 6.

FIG. 7 illustrates four sub-pixels 212, and the scanning signal line 342, the image signal line 312, and the high reference potential line 311 extend in each of the sub-pixels 212. In FIG. 7, for the purpose of describing the circuit of each sub-pixel 212, only a layer associated with a circuit lower than an anode electrode 350 is illustrated, and a layer structure associated with the light emission higher than the anode electrode 350 is omitted. Also, only a layout position of the anode electrode 350 is indicated by a dashed line.

As illustrated in FIG. 7, a first layer (331, 332) having a semiconductor portion 339 of the drive transistor 230 includes a drive transistor channel electrode 331 having the source and drain of the drive transistor 230 together with the semiconductor portion 339, and a first capacitor electrode 332 electrically independent from the drive transistor channel electrode 331, and made of an electric conductor. The drive transistor channel electrode 331 is connected to the anode electrode 350 through a contact hole 392, and also connected to the high reference potential line 311 through a contact hole 393. The first capacitor electrode 332 is connected to the high reference potential line 311 through a contact hole 394.

A second layer (321, 322) having a semiconductor portion 329 of the pixel transistor 220 includes a pixel transistor channel electrode 321 having the source and drain of the pixel transistor 220 together with the semiconductor portion 329 formed in a portion overlapping with the scanning signal line 342, and a second capacitor electrode 322 that is formed continuously to the pixel transistor channel electrode 321, and overlaps with the first capacitor electrode 332 in a plan view. The pixel transistor channel electrode 321 is connected to the image signal line 312 through a contact hole 391.

Figure 8:
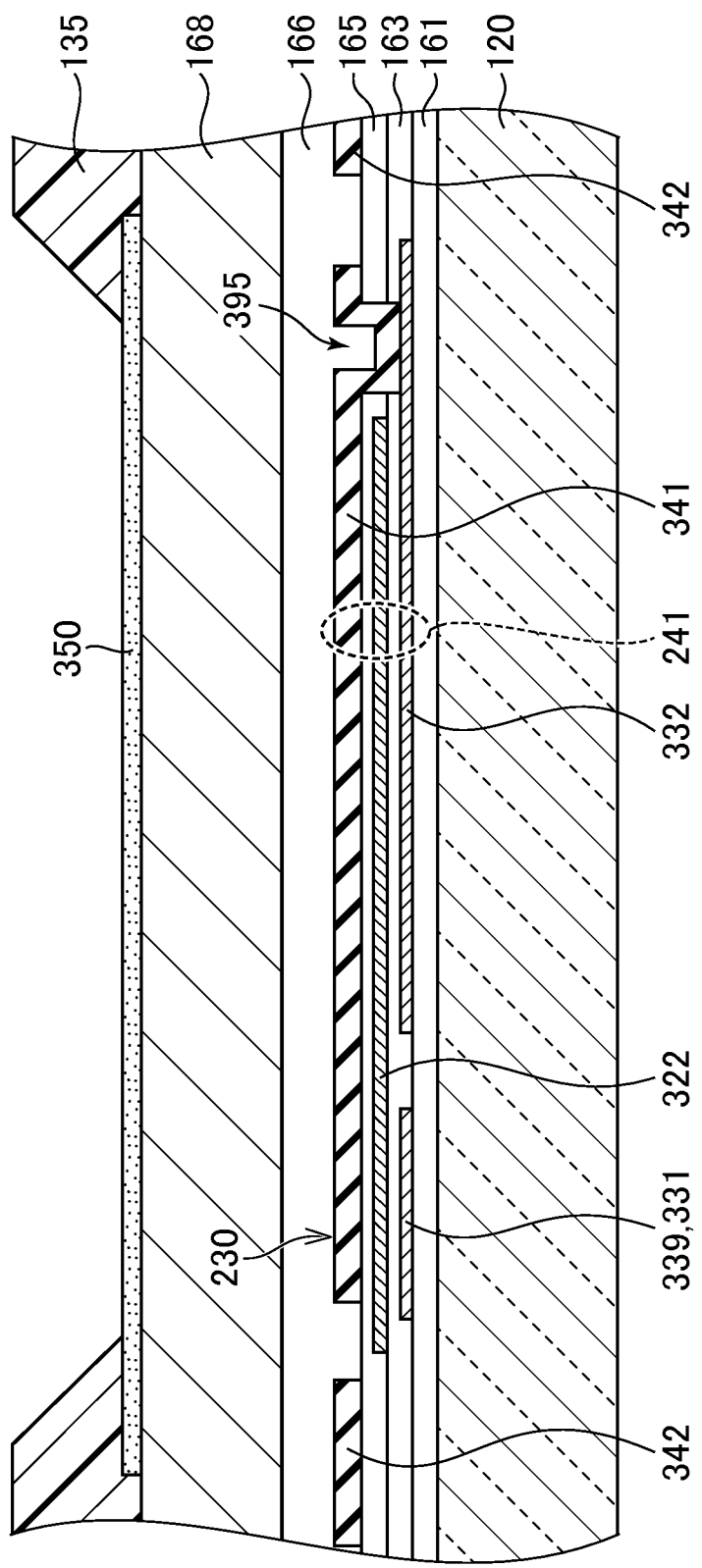
FIG. 8 is a schematic cross-sectional view taken along a line VIII-VIII of FIG. 7.
Figure 9:
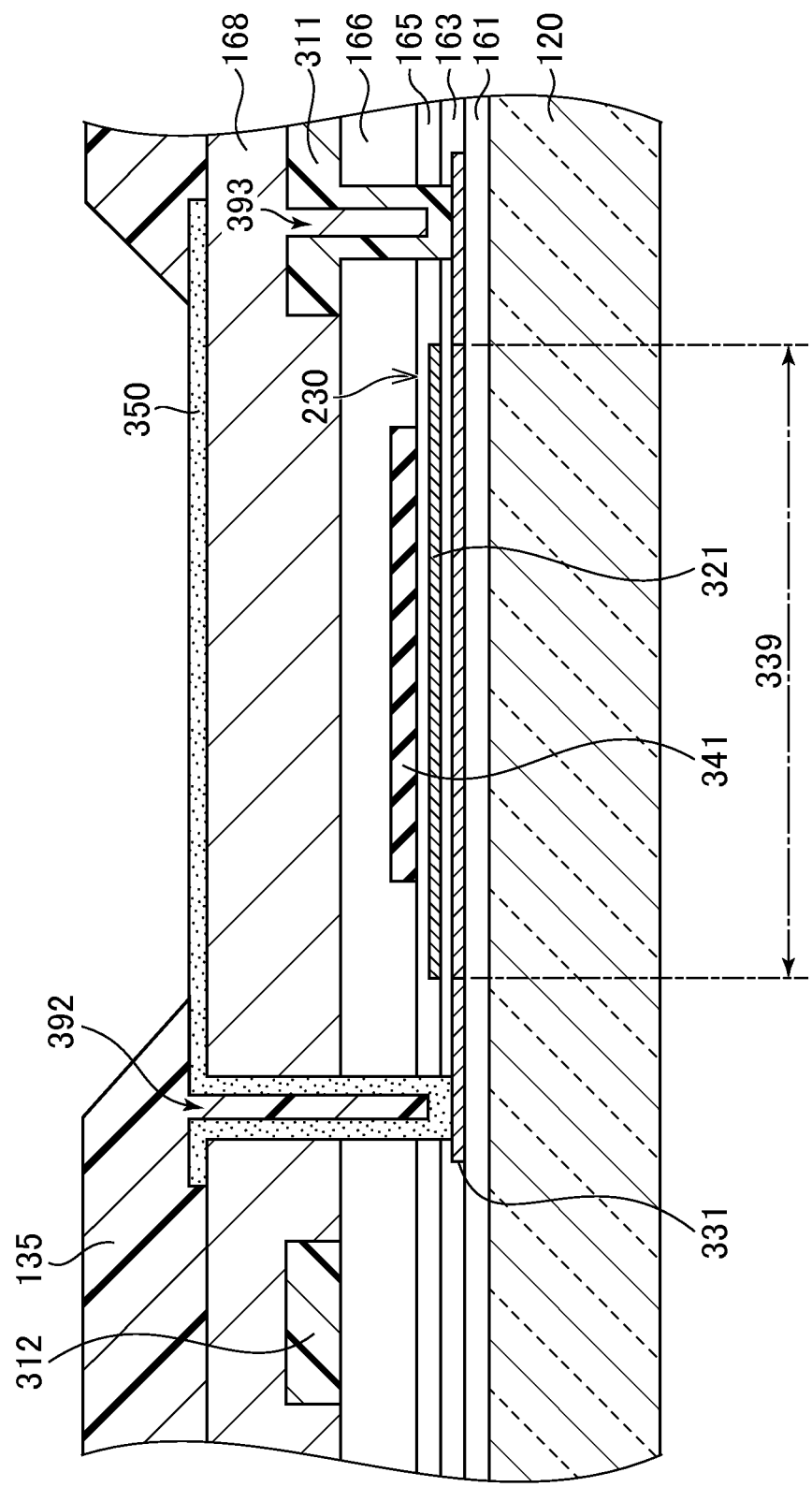
FIG. 9 is a schematic cross-section view taken along a line IX-IX of FIG. 7.

A third layer (341, 342) having the scanning signal line 342 includes a third capacitor electrode 341 that is electrically independent from the scanning signal line 342, electrically connected to the first capacitor electrode 332 through a contact hole 395, and arranged to sandwich the second capacitor electrode 322 in association with the first capacitor electrode 332 through insulating layers 163 and 165 (refer to FIGS. 8 and 9). The high reference potential line 311 and the image signal line 312 are formed over the third layer (341, 342) through an insulating layer 166.

In this embodiment, the first layer (331, 332) and the second layer (321, 322) are made of polysilicon, the amount of ion implantation is changed by the semiconductor portion 339, the semiconductor portion 329, and other portions to form a semiconductor portion and a conductor portion. Therefore, those "layers" in this embodiment are films formed in the same process at the same time. However, even if the source and drain and the semiconductor layer are formed in layers different from each other with the use of another semiconductor material such as amorphous semiconductor or an oxide film semiconductor, the "layer" of the first layer or the second layer is configured by a layer including the plural layers of the source and drain and the semiconductor layer whereby this embodiment can be applied to this configuration. Therefore, the first layer to the third layer may be each formed of a composite layer including the plural layers, and particularly the first layer and the second layer may be each formed of a composite layer including the semiconductor layer and the conductor layer of the source/drain.

Also, ends of the first layer (331, 332) and the second layer (321, 322) are formed at a distance from the semiconductor portion or the connection portion such as the contact holes, and the amount of ion implantation on the ends is reduced with the result that a so-called LDD (low doped drain) structure that reduces an electric field generated in the crystal grain boundary may be used. Also, the high reference potential line 311, the image signal lines 312, and the conductor portion of the third layer can be made of metal such as Al, Cu, Au, Ti, Mo, or W, or organic material having the conductivity such as doped polysilicon. Further, the high reference potential line 311 and the image signal lines 312 may be formed by lines having a Ti/Al/Ti structure in which Al is sandwiched between Ti.

FIG. 8 is a schematic cross-sectional view taken along a line VIII-VIII of FIG. 7. In FIG. 8, films upper than a pixel separation film 135 that is formed to cover an end of the anode electrode 350 with resin, and isolates between the anode electrodes 350 of the adjacent sub-pixels 212 are omitted. As illustrated in this cross-sectional view, the first layer (331, 332) is formed on a base film 161 made of an insulating material such as SiNx, and includes the drive transistor channel electrode 331 and the first capacitor electrode 332, and the first capacitor electrode 332 is connected to the third capacitor electrode 341 of the third layer (341, 342) through the contact hole 395 opened in the insulating layers 163 and 165. The second capacitor electrode 322 of the second layer (321, 322) is formed between the insulating layers 163 and 165 made of an insulating material such as SiNx, and the capacitor 241 in the circuit diagram of FIG. 6 is formed by the first capacitor electrode 332, the second capacitor electrode 322, and the third capacitor electrode 341.

FIG. 9 is a schematic cross-sectional view taken along a line IX-IX of FIG. 7. As illustrated in this cross-sectional view, the drive transistor channel electrode 331 is connected to the high reference potential line 311 formed in the same layer with the image signal line 312 on the insulating layer 166 through the contact hole 393, and also connected to the anode electrode 350 formed on a planarization film 168 made of resin such as acrylic or polyimide through the contact hole 392. An overlap portion of the drive transistor channel electrode 331 with the pixel transistor channel electrode 321 forms the semiconductor portion 339.

As described above, according to this embodiment, because the semiconductor portion 339 of the drive transistor 230 and the semiconductor portion 329 of the pixel transistor 220 are formed in the first layer (331, 332) and the second layer (321, 322), respectively, a larger capacitor electrode can be formed, the potential difference can be more stably retained, and display can be performed with higher quality. Also, because a space can be efficiently used in each of the sub-pixels 212, even if the higher definition progresses, the larger capacitor electrode can be provided, and display can be performed with high quality.

In the above embodiment, the structure having the third capacitor electrode 341 is provided. However, if a more sufficient capacitor can be formed by the first capacitor electrode 332 and the second capacitor electrode 322, the third capacitor electrode 341 may not be provided. Also, in the above-described embodiment, a case in which two transistors are present in each of the sub-pixels 212, and two semiconductor layers are provided has been described. Alternatively, three or more transistors may be provided, or three semiconductor layers may be provided.

Figure 10:
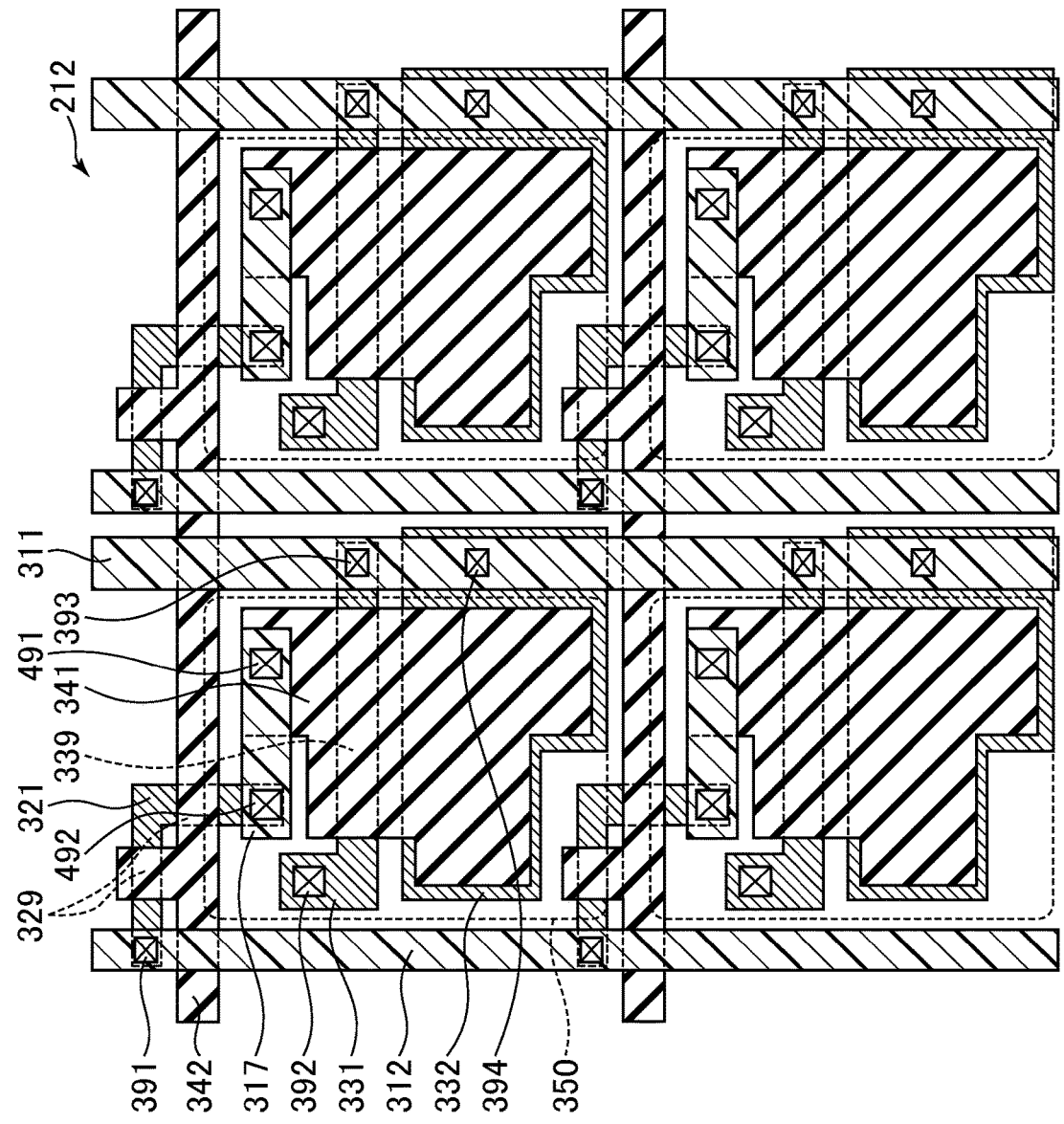
FIG. 10 is a diagram illustrating a comparative example of an embodiment.

FIG. 10 is a diagram illustrating a comparative example of the above embodiment. In a comparative example of FIG. 10, the semiconductor portion 339 of the drive transistor 230 and the semiconductor portion 329 of the pixel transistor 220 are formed in the same layer. When the semiconductor portions 339 and 329 are formed in the same layer in this way, a jumper wiring 317 and contact holes 491, 492 for connecting the pixel transistor channel electrode 321 and the third capacitor electrode 341 are required. Those components are required for improving the manufacture efficiency by performing a process of opening the contact holes at the same time, but cause the structure of the sub-pixels 212 to be complicated, and the yield of products to be deteriorated. Also, because the pixel transistor channel electrode 321 and the drive transistor channel electrode 331 are formed in the same layer, not only one capacitor electrode is formed in the same layer as those layers, but also the size of the capacitor electrode is reduced, resulting in a risk that the sufficient capacitor cannot be ensured.

However, according to the configuration of the above embodiment illustrated in FIG. 7, because the pixel transistor channel electrode 321 and the drive transistor channel electrode 331 are formed in the different layers, the capacitor electrodes can be provided in the respective layers, and the size of the capacitor electrodes in the respective layers can increase. Also, because the source or drain of the pixel transistor 220 forms the gate of another drive transistor, there is no need to provide the jumper wiring 317 of FIG. 10, and the wiring and the manufacturing process can be provided with high efficiency. Therefore, in a circuit within the sub-pixel 212, the more stable potential difference can be retained, the display can be performed with the higher quality, and the yield can be improved.

Figure 11:
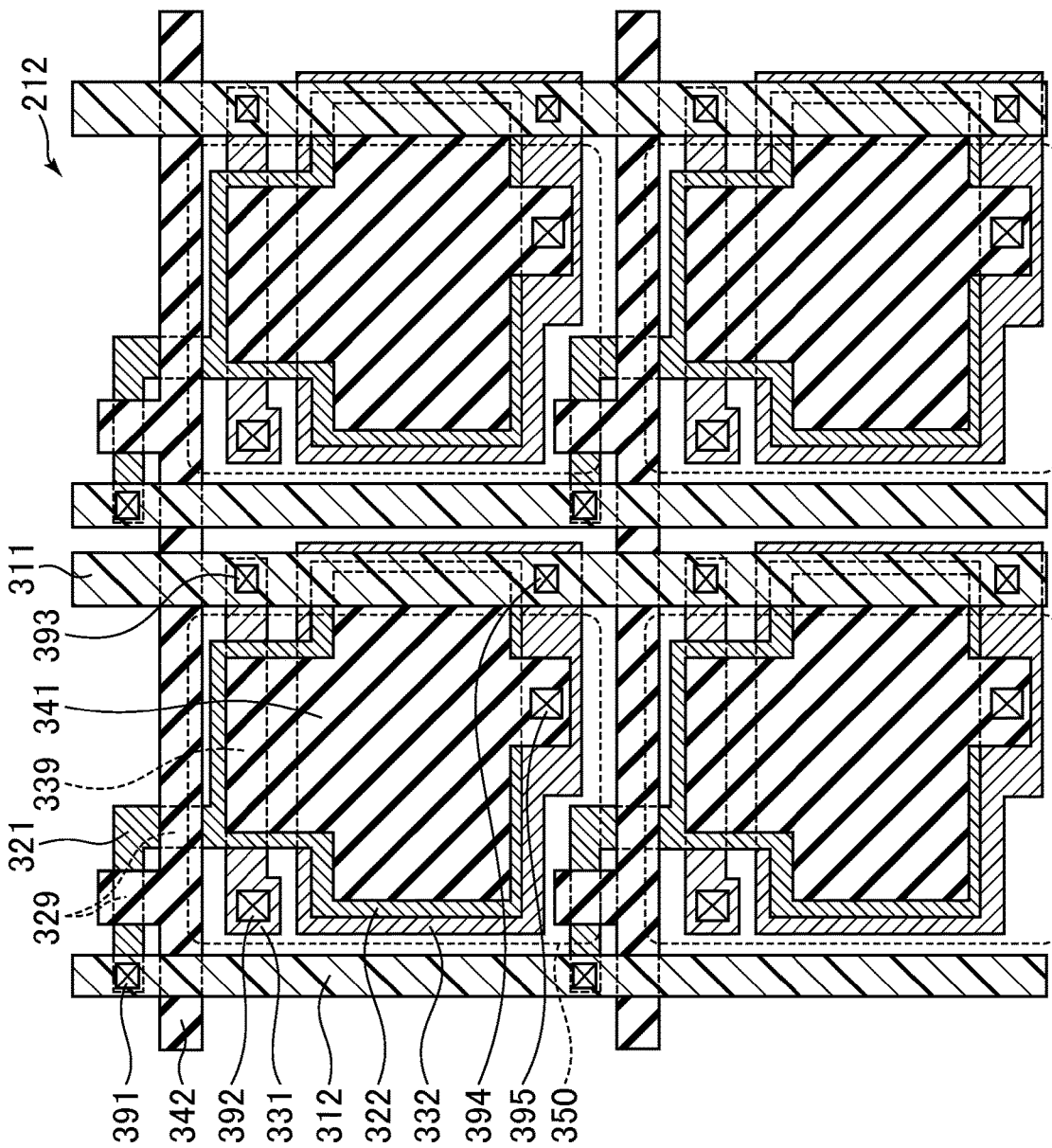
FIG. 11 is a diagram illustrating a first modification of this embodiment from the same view field as that in FIG. 7.

FIG. 11 is a diagram illustrating a first modification of the above embodiment from the same view field as that in FIG. 7. The first modification is different from the above embodiment in that the second capacitor electrode 322 and the third capacitor electrode 341 extend to a region overlapping with the high reference potential line 311, and the other configuration is identical with that of FIG. 7. With the provision of the second capacitor electrode 322 and the third capacitor electrode 341 which overlap with the high reference potential line 311 applied with the constant potential in this way, the potential retained by the second capacitor electrode 322 and the third capacitor electrode 341 can be more stabilized with the results that the display can be performed with the higher quality. Also, in the first modification, a configuration having no third capacitor electrode 341 can be provided, and in this case, with a configuration in which only the second capacitor electrode 322 overlaps with the high reference potential line 311, the potential can be stabilized, and the display can be performed with high quality.

Figure 12:
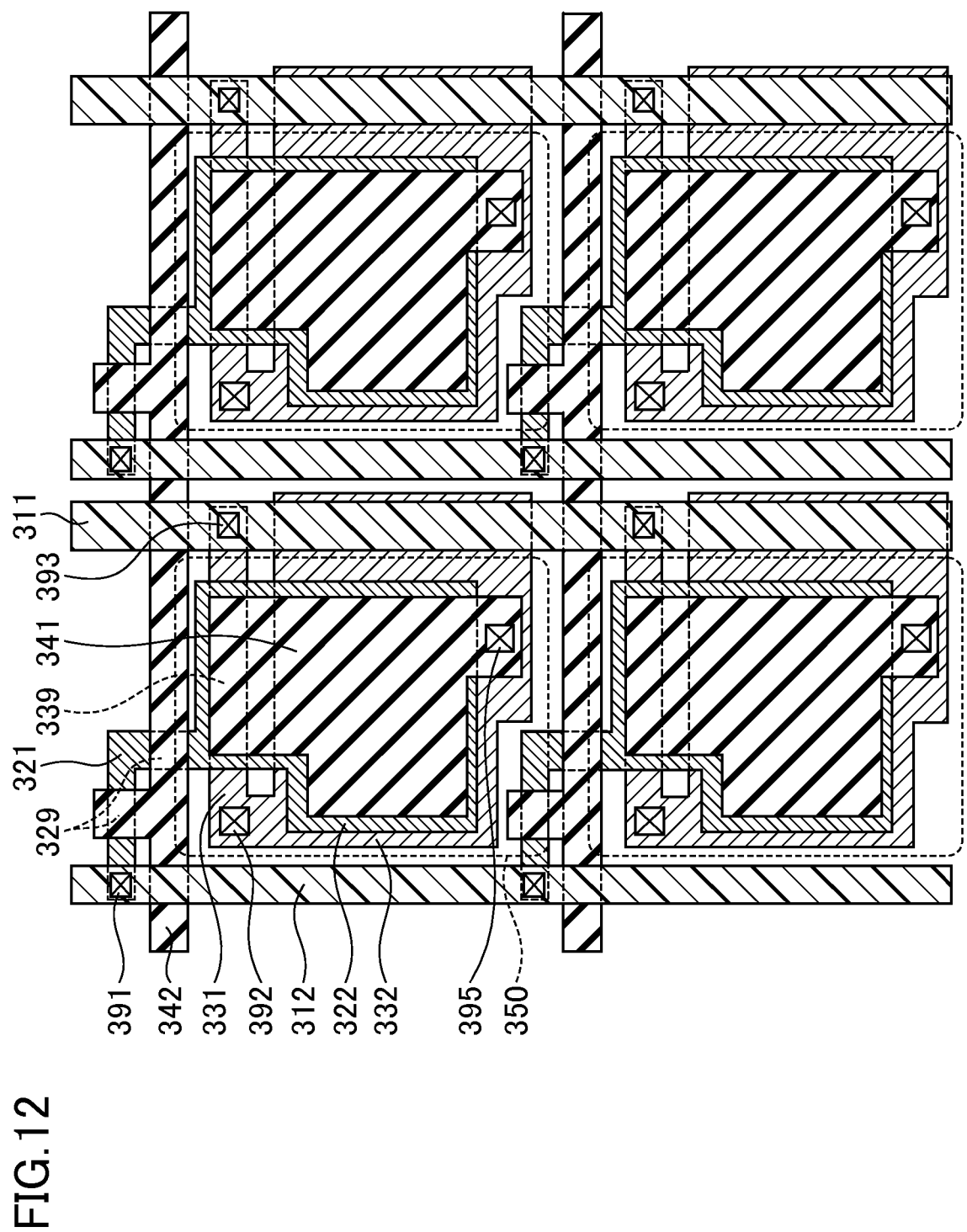
FIG. 12 is a diagram illustrating a second modification of this embodiment from the same view field as that in FIG. 7.

FIG. 12 is a diagram illustrating a second modification of the above embodiment from the same view field as that in FIG. 7. The second modification is different from the above embodiment in that the contact hole 394 is not provided, the first capacitor electrode 332 is not connected to the image signal line 312, and instead the first capacitor electrode 332 is connected to the organic EL element 130 side (drain side of the drive transistor 230 if the drive transistor 230 is formed of a p-type semiconductor) of the drive transistor channel electrode 331. With the above configuration, the first capacitor electrode 332, the second capacitor electrode 322, and the third capacitor electrode 341 form the capacitor 242 in the circuit diagram of FIG. 6. Even if the capacitor 242 is formed as a larger capacitor, the potential difference can be more stably retained, and the display can be performed with the higher quality. Therefore, the same advantages as those in the above embodiment can be obtained. Also, in the second modification of FIG. 12, as with the first modification of FIG. 11, the second capacitor electrode 322 and the third capacitor electrode 341 may be formed to overlap with the high reference potential line 311. In this case, the same advantages as those in the first modification can be obtained. Also, in the second modification, a configuration having no third capacitor electrode 341 can be provided. If the drive transistor 230 is made of an n-type semiconductor, the first capacitor electrode 332 is connected to the source side of the drive transistor 230.

Second Aspect of Present Invention

Hereinafter, the respective embodiments according to the second aspect of the invention will be described with reference to the drawings. Meanwhile, the description is merely an example, and a matter, such as an appropriate change without departing the spirit of the invention, which can be easily conceived by those skilled in the art is surely included in the scope of the present invention. It should be noted that in order to facilitate understanding of the description, width, thickness, and shape of each portion are schematically shown as compared with those actually used in some cases; however, the drawings are merely an example and thus the invention is not limited thereto. In addition, in the specification and drawings, the same constituent elements as in the above-described drawings are given the same reference numerals, and the specific description will be properly omitted.

First Embodiment

A configuration of a display device according to the first embodiment of the second aspect in the invention will be described with reference to FIG. 13 to FIG. 18.

Outline of Display Device

Figure 13:
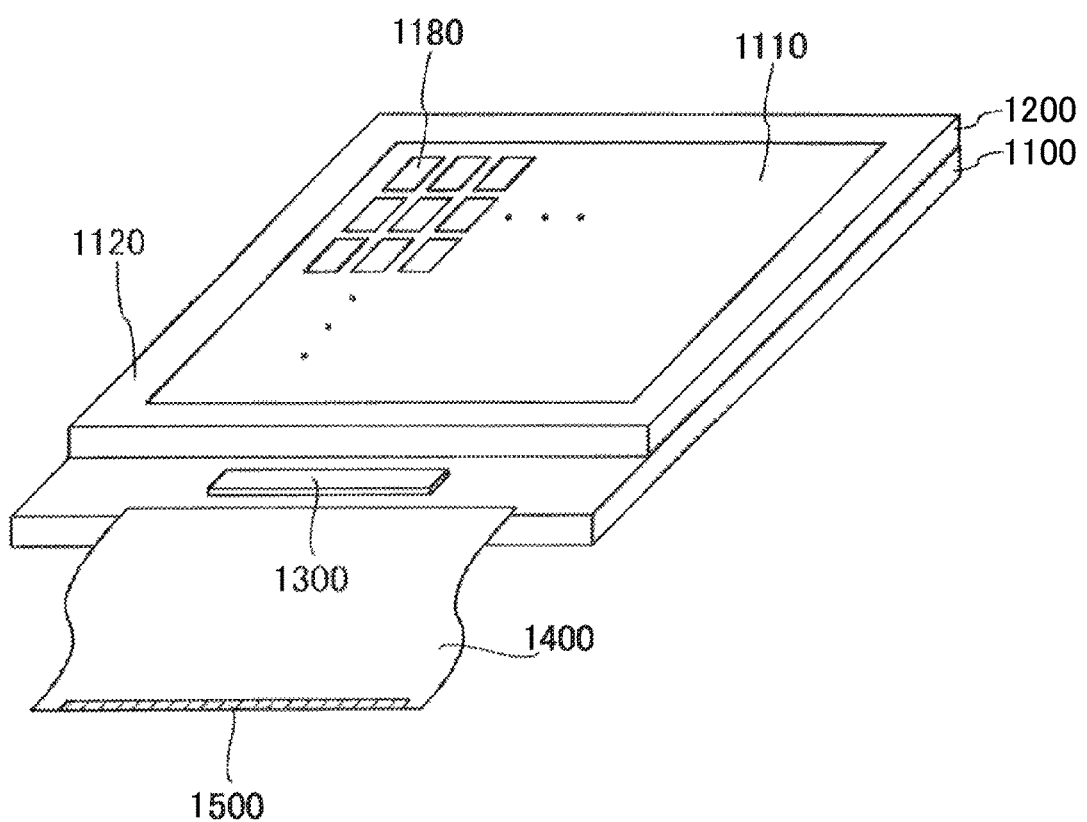
FIG. 13 is a perspective view of the display device in an embodiment according to a second aspect of the invention.

First, an outline of the display device according to the first embodiment will be described with reference to FIG. 13 and FIG. 14. FIG. 13 is a perspective view of the display device in the first embodiment according to the second aspect of the invention. In addition, FIG. 14 is a plan view of the display device in the first embodiment according to the second aspect of the invention.

Figure 14:
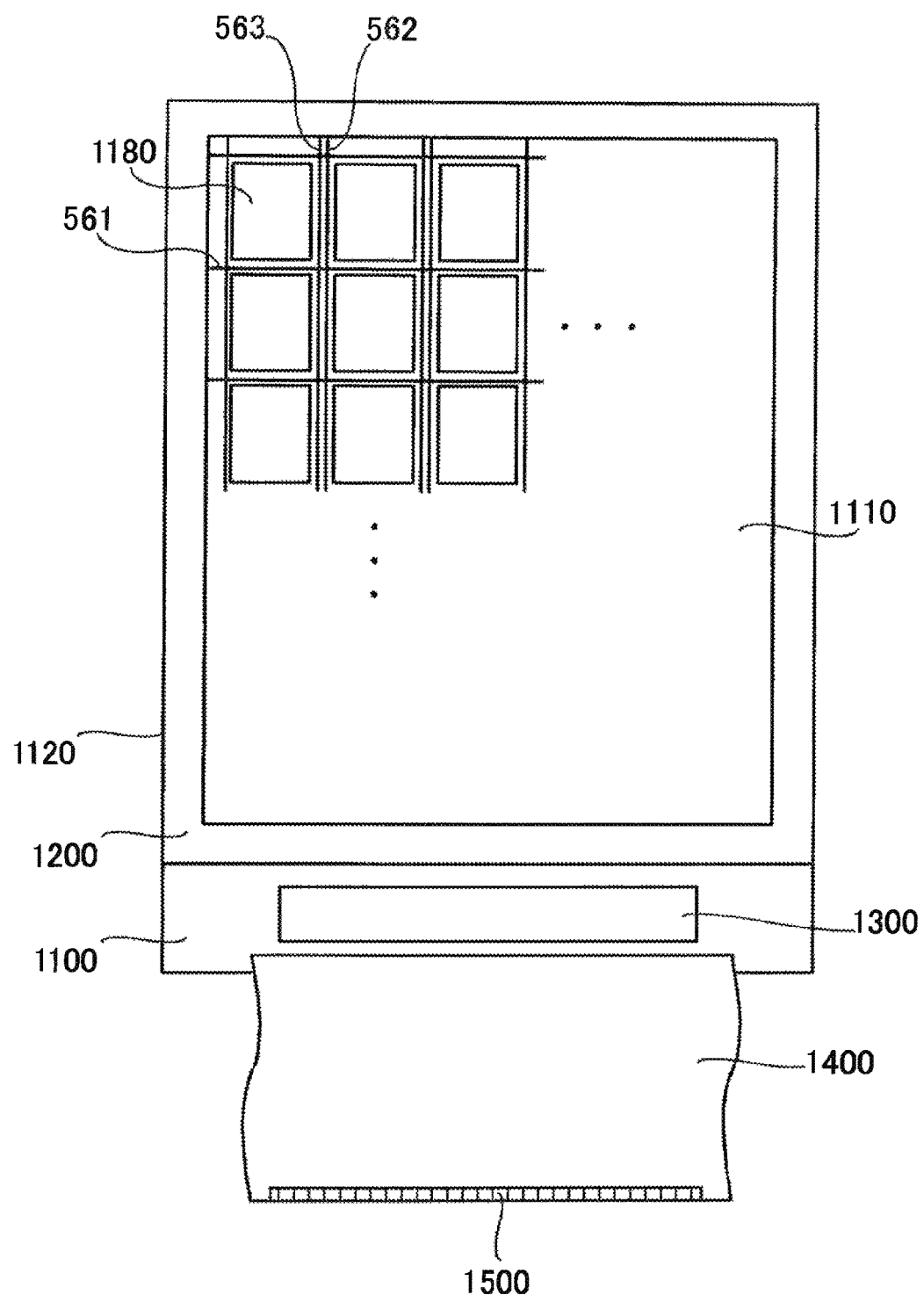
FIG. 14 is a plan view of the display device in this embodiment according to the second aspect of the invention.

As illustrated in FIG. 13 and FIG. 14, the display device in the first embodiment is provided with a light emitting element which is provided in each of a plurality of pixels, a substrate 1100 including a display area 1110 in which pixels 1180 are arranged in a matrix, a counter substrate 1200 facing the substrate 1100, a driver IC 1300 which is provided in an area to which the substrate 1100 is exposed, and a flexible printed circuit (FPC) 1400. The substrate 1100 is divided into a display area 1110 and a peripheral area 1120 which is positioned around the display area 1110. In the substrate 1100, the pixels 1180 are arranged in the display area 1110 in a matrix, and a pixel circuit, which will be described in the first embodiment, is disposed in each of the plurality of pixels 1180. The FPC 1400 is provided with a terminal portion 1500 connected to a controller circuit for controlling a driving circuit.

In reference with FIG. 14, in the display area 1110, a gate line 561 on a horizontal direction and a signal line 562 and a power line 563 on a vertical direction are arranged in a matrix. The pixel 1180 corresponds to an area which is surrounded by the gate line 561, signal line 562, and power line 563. For the sake of description, FIG. 14 illustrates such that the pixel 1180 does not overlap the area which is surrounded by the gate line 561, signal line 562, and power line 563; however, a pixel area and the aforementioned lines may overlap with each other when viewed from top.

Circuit Diagram of Pixel

Next, a pixel circuit of the first embodiment will be described with reference to FIG. 15.

Figure 15:
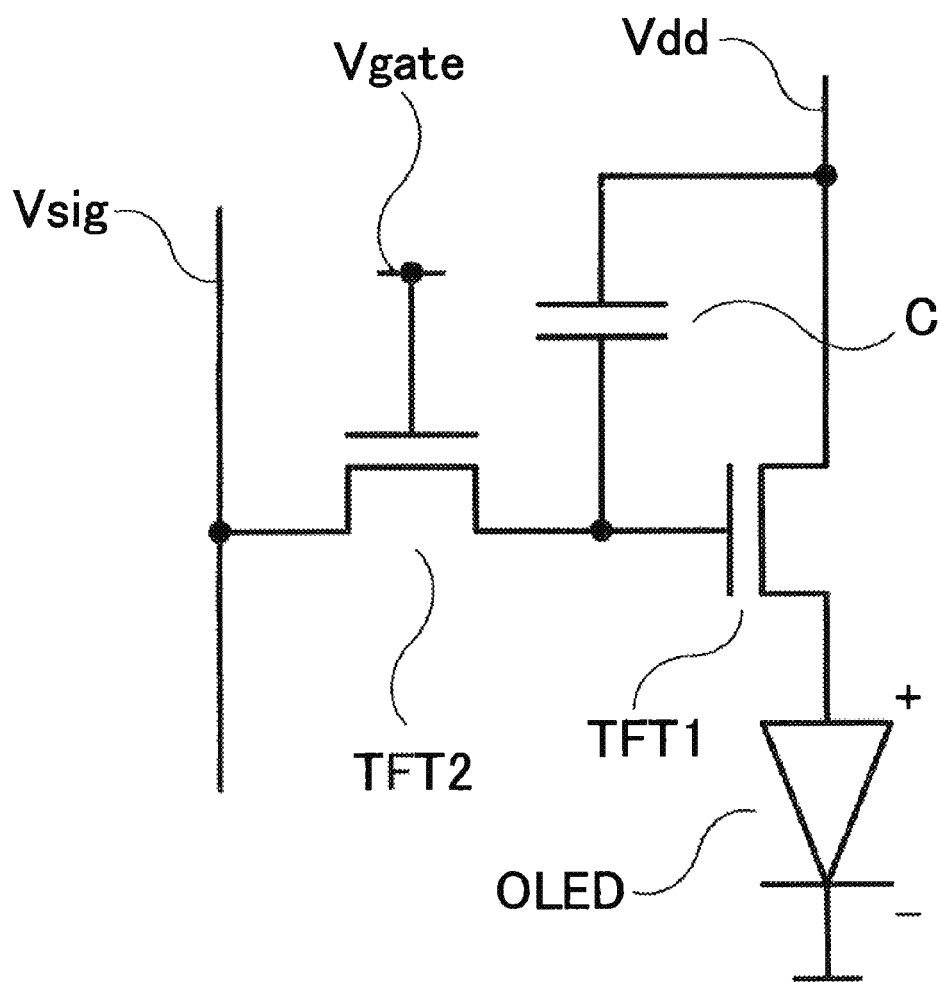
FIG. 15 is a diagram illustrating a pixel circuit of the display device in this embodiment according to the second aspect of the invention.

As illustrated in FIG. 15, the pixel circuit of the first embodiment is formed of a capacitor C, thin film transistors TFT1 and TFT2, a gate line Vgate, a signal line Vsig, and a power line Vdd. Here, the TFT2 is described as an n-type semiconductor. A gate of the TFT2 is connected to the gate line Vgate, a source is connected to the signal line Vsig, and a drain is connected to one end of the capacitor C and the gate of the TFT1. When a predetermined voltage is applied to the gate of the TFT2, the TFT2 applies a potential in response to the signal line Vsig to the capacitor C. A potential of the gate of the TFT1 is retained in the capacitor C, and the gate of the TFT1 supplies a current corresponding to a charge of the capacitor C from the power line Vdd to an anode of an OLED. A cathode of the OLED is connected to a ground electrode or an electrode of a negative potential.

Configuration of Pixel

Next, a structure and a forming method of the pixel in the first embodiment will be described with reference to FIG. 16 to FIG. 19. FIG. 16 to FIG. 19 are perspective plan views when viewed from the display area side of the display device, and illustrate an area 2×2 pixels arranged in the vertical and horizontal directions.

Figure 16:
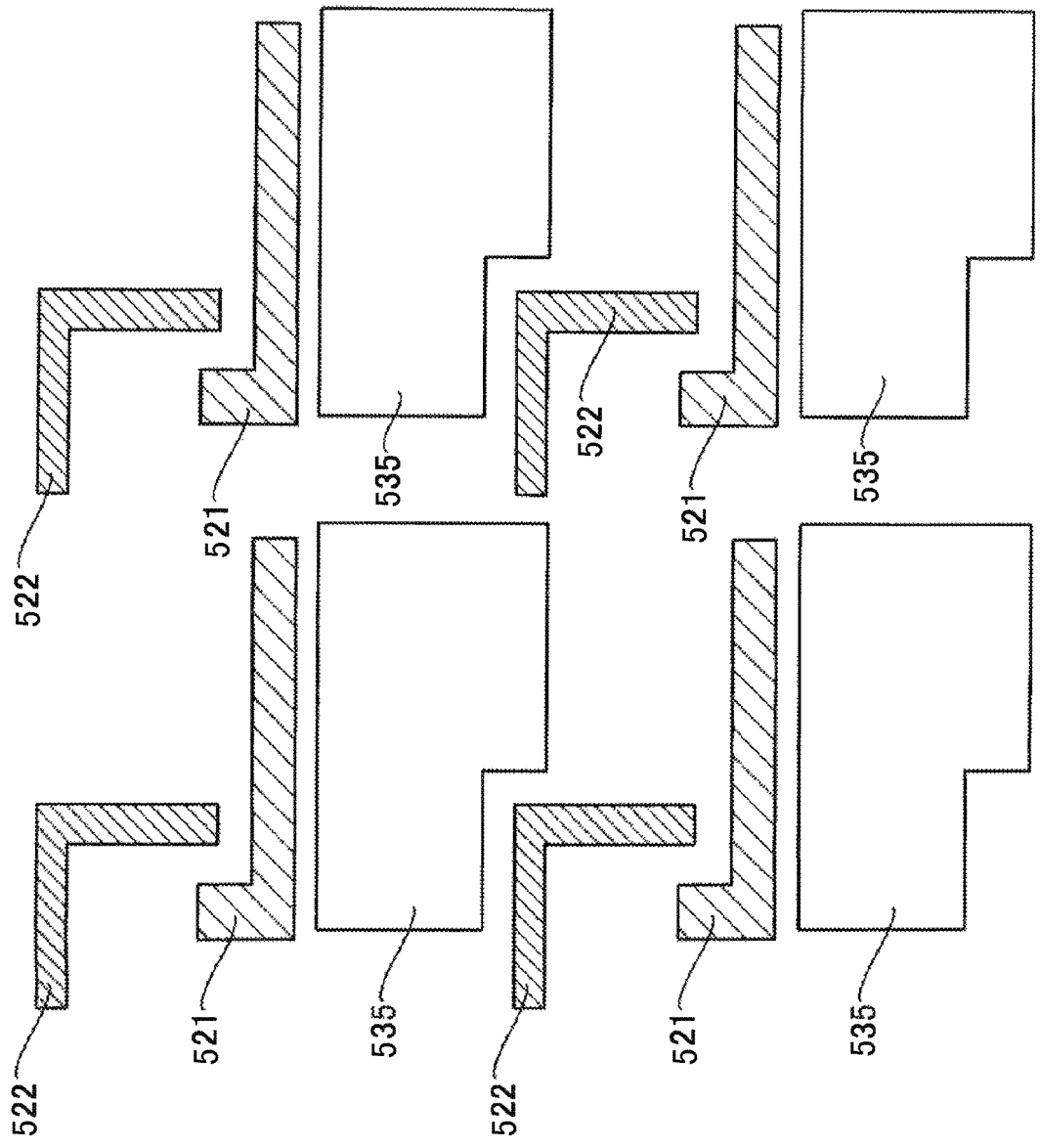
FIG. 16 is a plan view of the pixel circuit of the display device in a first embodiment according to the second aspect of the invention.

FIG. 16 illustrates a state in which a low-temperature poly silicon (LIPS) layer 521, an oxide semiconductor layer 522, and an electrode layer 535 are formed and disposed on the same insulating layer. The LIPS layer 521 corresponds to a channel semiconductor layer of a TFT which supplies a current to the OLED from the power line, and the TFT corresponds to the TFT1 shown in the circuit diagram of FIG. 15. Note that, various types of polycrystalline silicon may be used instead of the LIPS layer 521. The oxide semiconductor layer 522 corresponds to a channel semiconductor layer of a TFT which applies a potential in response to the signal line to the capacitor, and the TFT corresponds to the TFT2 shown in the circuit diagram of FIG. 15. Examples of a material for the oxide semiconductor layer 522 include an oxide such as indium, zinc, tin, and gallium. The electrode layer 535 is electrically connected to the power line thereafter, and forms an end of the capacitor C shown in the circuit diagram of FIG. 15.

In the first embodiment, the LIPS layer 521 and the oxide semiconductor layer 522 are formed on the same insulating layer; however, it is preferable that the LIPS layer 521 is formed first, and then the oxide semiconductor layer 522 is formed. The oxide semiconductor is formed by using a DC sputtering method or the like, and can be formed at a low temperature compared with a case of the LIPS. Accordingly, the LIPS layer 521 which is formed at a relatively high temperature is formed first, and then the oxide semiconductor layer 522 which can be formed at a relatively low temperature is formed, and therefore, it is possible to prevent a portion which can be formed at a low temperature from being exposed to unnecessary high temperature environment, thereby suppressing the influence by the high temperature.

Figure 17:
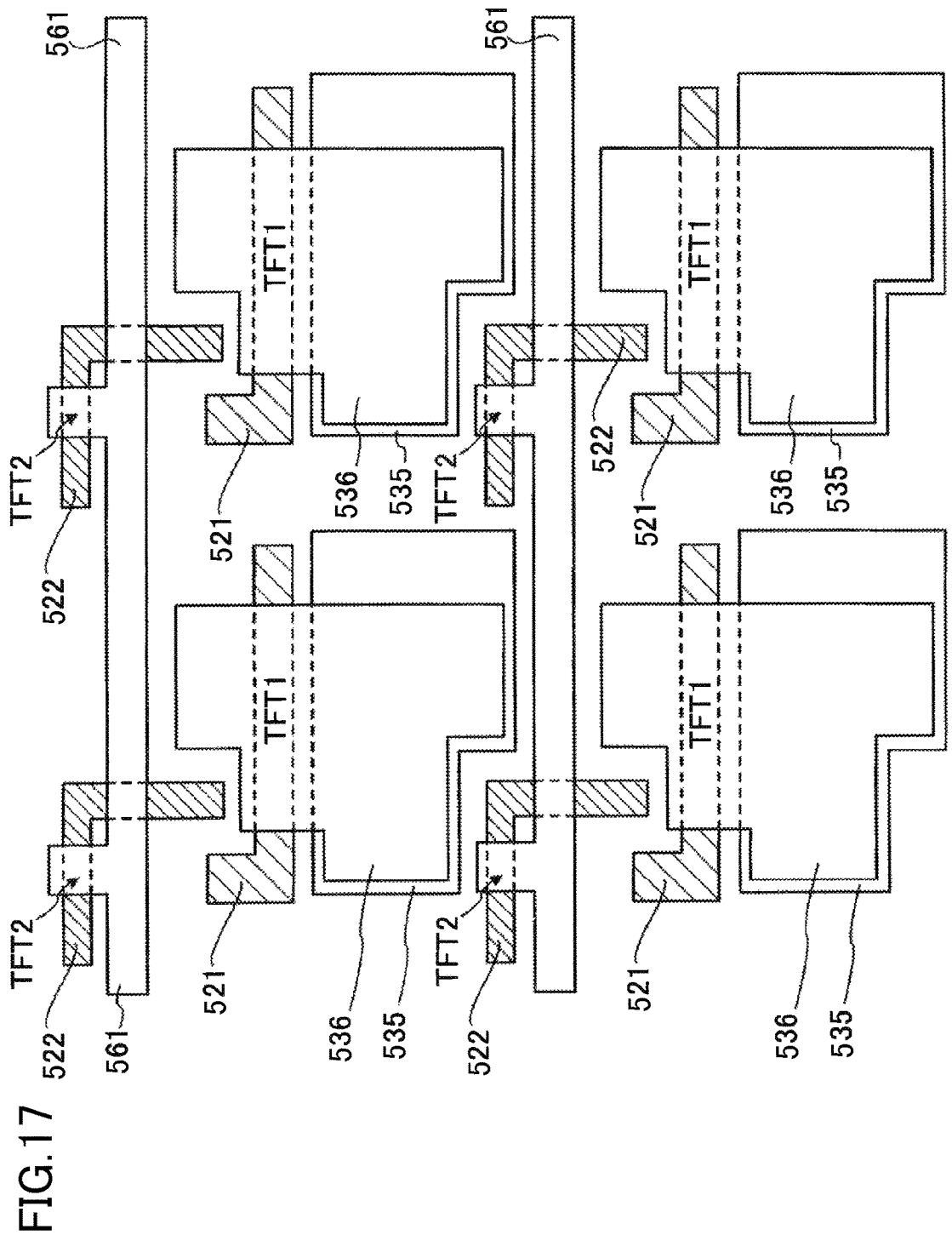
FIG. 17 is a plan view of the pixel circuit of the display device in the first embodiment according to the second aspect of the invention.

FIG. 17 is a plan view illustrating a state in which an insulating layer is formed on the LIPS layer 521, the oxide semiconductor layer 522, and the electrode layer 535 which are formed in FIG. 16, and a gate line 561 and an electrode layer 536 are formed and disposed on the aforementioned insulating layer. The gate line 561 is linearly formed in the horizontal direction, and an area in which a portion which is extended in the vertical direction from the gate line 561 and the oxide semiconductor layer 522 overlap with each other is formed. The electrode layer 536 is, thereafter, electrically connected to the drain of the TFT2 via a jumper wiring, and forms the other end of the capacitor C. The electrode layer 535 and electrode layer 536 form the capacitor C at a portion in which the electrode layer 535 and electrode layer 536 overlap with each other with the insulating layer interposed therebetween.

Figure 18:
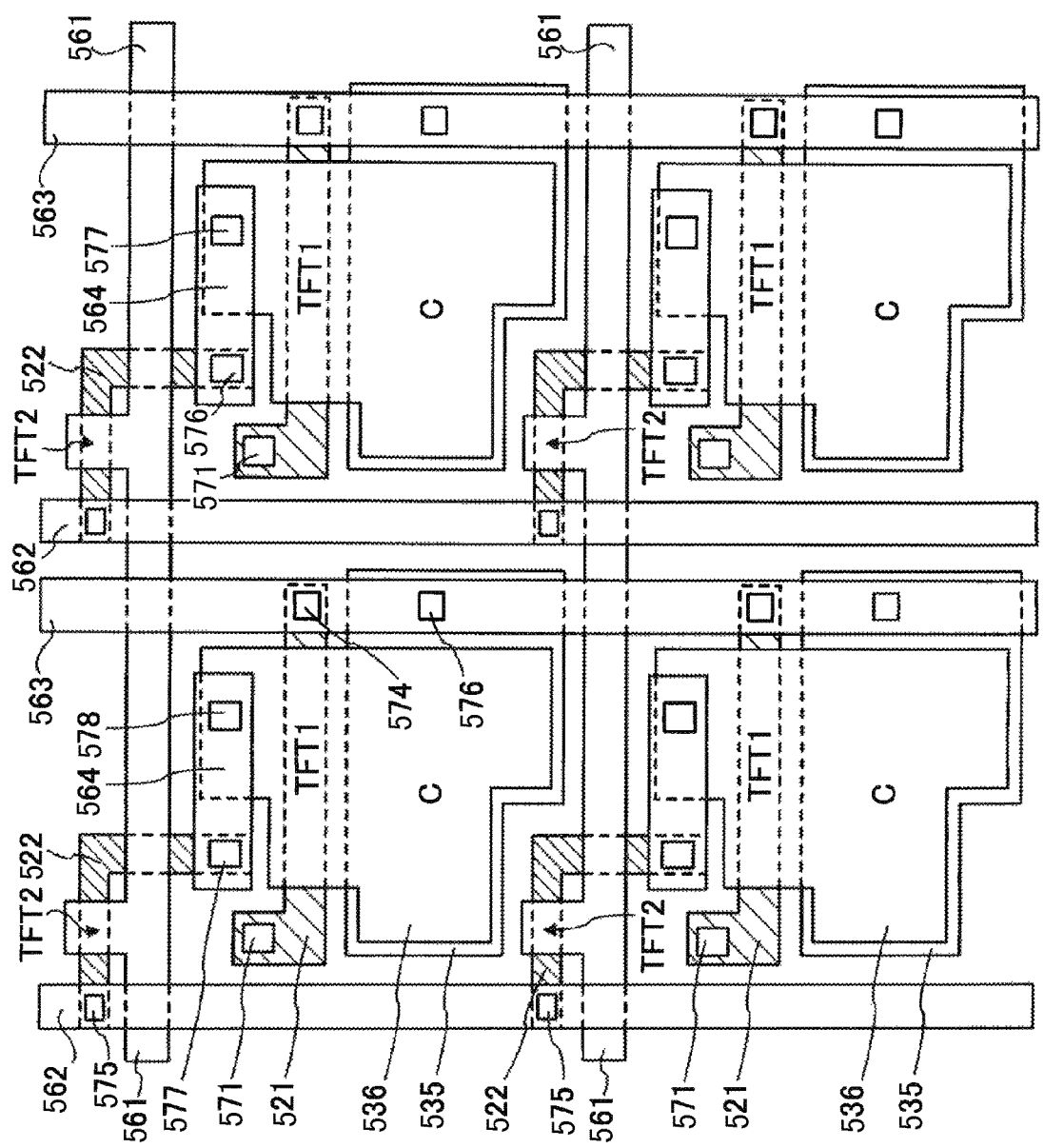
FIG. 18 is a plan view of the pixel circuit of the display device in the first embodiment according to the second aspect of the invention.

FIG. 18 is a plan view illustrating a state in which an insulating layer is formed on the gate line 561 and electrode layer 536 which are formed in FIG. 17, and a signal line 562, a power line 563, and a jumper wiring 564 are formed and disposed on the aforementioned insulating layer.

The signal line 562 is formed by extending in the vertical direction while being adjacent to the power line 563. The oxide semiconductor layer 522 and the signal line 562 overlap with each other in an area, and are electrically connected to each other through a via 575 formed on the area. In addition, the oxide semiconductor layer 522 is electrically connected to the jumper wiring 564 through a via 577, and the electrode layer 536 is electrically connected to the jumper wiring 564 through a via 578. The gate of the TFT2 is formed in an area in which a portion which is extended in the vertical direction from the gate line 561 and the oxide semiconductor layer 522 overlap with each other, and the via 575 and the via 577 respectively correspond to a source electrode and a drain electrode.

The gate of the TFT1 is formed in an area in which the LTPS layer 521 and the electrode layer 536 overlap with each other. The LTPS layer 521 and the power line 563 are electrically connected to each other through a via 574, and an anode contact hole 571 is formed in the LTPS layer 521, and a predetermined current is supplied to the OLED from the power line 563.

The electrode layer 535 and the electrode layer 536 form an area in which the electrode layer 535 and electrode layer 536 overlap with each other with the insulating layer interposed therebetween, and constitute the capacitor C. When referring to the circuit diagram in FIG. 15, the electrode layer 535 corresponds to an electrode on the power line Vdd side of the capacitor C, and the electrode layer 536 corresponds to an electrode on the drain of the TFT2 side and the gate of the TFT1 side of the capacitor C. The electrode layer 536 is electrically connected to the jumper wiring 564 through a via 578, and thus, is electrically connected to the oxide semiconductor layer 522. The electrode layer 535 is electrically connected to the power line 563 through a via 576 which is formed in an area in which the electrode layer 535 overlaps the power line 563.

Figure 19:
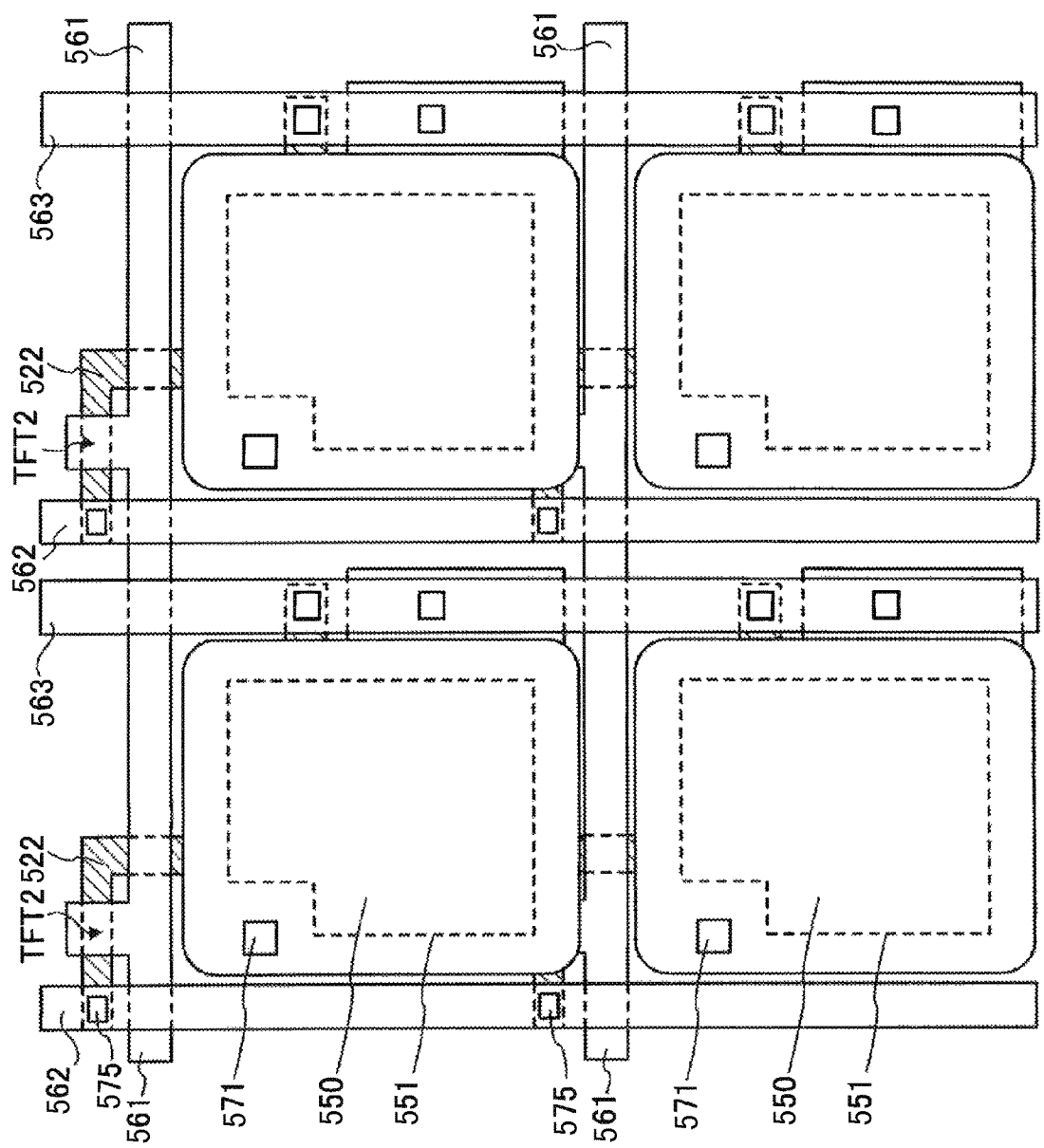
FIG. 19 is a plan view of the pixel circuit of the display device in the first embodiment according to the second aspect of the invention.

FIG. 19 is a plan view illustrating a state in which a planarization layer is formed and then an anode 550 is formed on the signal line 562, the power line 563, and the jumper wiring 564 which are formed in FIG. 18. The anode 550 is formed in a pixel area which is vertically surrounded by the gate line 561, and horizontally surrounded by the signal line 562 and the power line 563. A bank is formed so as to surround the anode 550 and the anode contact hole 571, and an area which is surrounded by a dotted line 551 is an opening portion.

As described in FIG. 13 to FIG. 19, in the first embodiment, two different types of TFTs such as the TFT1 of which the channel semiconductor layer is the LIPS, and the TFT2 of which the channel semiconductor layer is the oxide semiconductor, are disposed on the same insulating layer. Here, when comparing leakage current properties of the respective TFT1 and TFT2, the leakage current of the TFT1 is substantially equal to or less than $10^{-12}$ A/μm per channel length of 1 μm while the leakage current of the TFT2 is substantially equal to or less than $10^{-16}$ A/μm per channel length of 1 μm. From this result, it is found that the TFT2 is more excellent in the low leakage properties. In the first embodiment, the TFT2 which is excellent in the low leakage properties (the TFT of which the channel semiconductor layer is the oxide semiconductor) is used as a TFT for writing a video signal into the capacitor, and thus when retaining the video signal in the capacitor, it is possible to prevent the leakage currents and unnecessary potentials, thereby suppressing variation of the video signal. In the related art, in order to prevent the leakage current of the capacitor, a dual gate structure is employed in addition to a basic pixel circuit structure, or a large capacitor for preparing the leakage current is disposed, but this results in disturbing a reduction in a pixel area in accordance with high definition of the display device. However, since there is no need to employ the technique and structure in the related art, the first embodiment focuses on the high definition of the display device.

On the other hand, when comparing mobility (moving amount of electron) of each of the TFT1 and the TFT2, the mobility of TFT1 is substantially equal to or greater than 100 $cm^2/Vs$ while the mobility of TFT2 is substantially equal to or greater than 10 $cm^2/Vs$. From this result, it is found that the TFT1 is more excellent in the mobility. Also in the TFT2, a threshold voltage (Vth) is easily changed. In the first embodiment, the TFT1 (the TFT of which the channel semiconductor layer is the LIPS) which is excellent in the mobility and has great driving performance is used as a TFT for supplying the current corresponding to the charge in the capacitor to the LED from the power line.

As such, in the first embodiment, it is possible to realize a high-quality operation of a high-definition pixel by perfectly disposing the TFT which uses different elements in the pixel circuit in a suitable position.

Second Embodiment

Next, a configuration of a display device according to the second embodiment of the second aspect in the invention will be described with reference to FIG. 20 to FIG. 28. Note that, portions which are not specifically mentioned are common in the second embodiment and the first embodiment.

First, a structure of the display device and a forming method thereof according to the second embodiment will be described with reference to FIG. 20 to FIG. 24. Similar to FIG. 16 to FIG. 19, FIG. 20 to FIG. 24 are perspective plan views when viewed from the display area side of the display device, and illustrate an area 2×2 pixels arranged in the vertical and horizontal directions.

Figure 20:
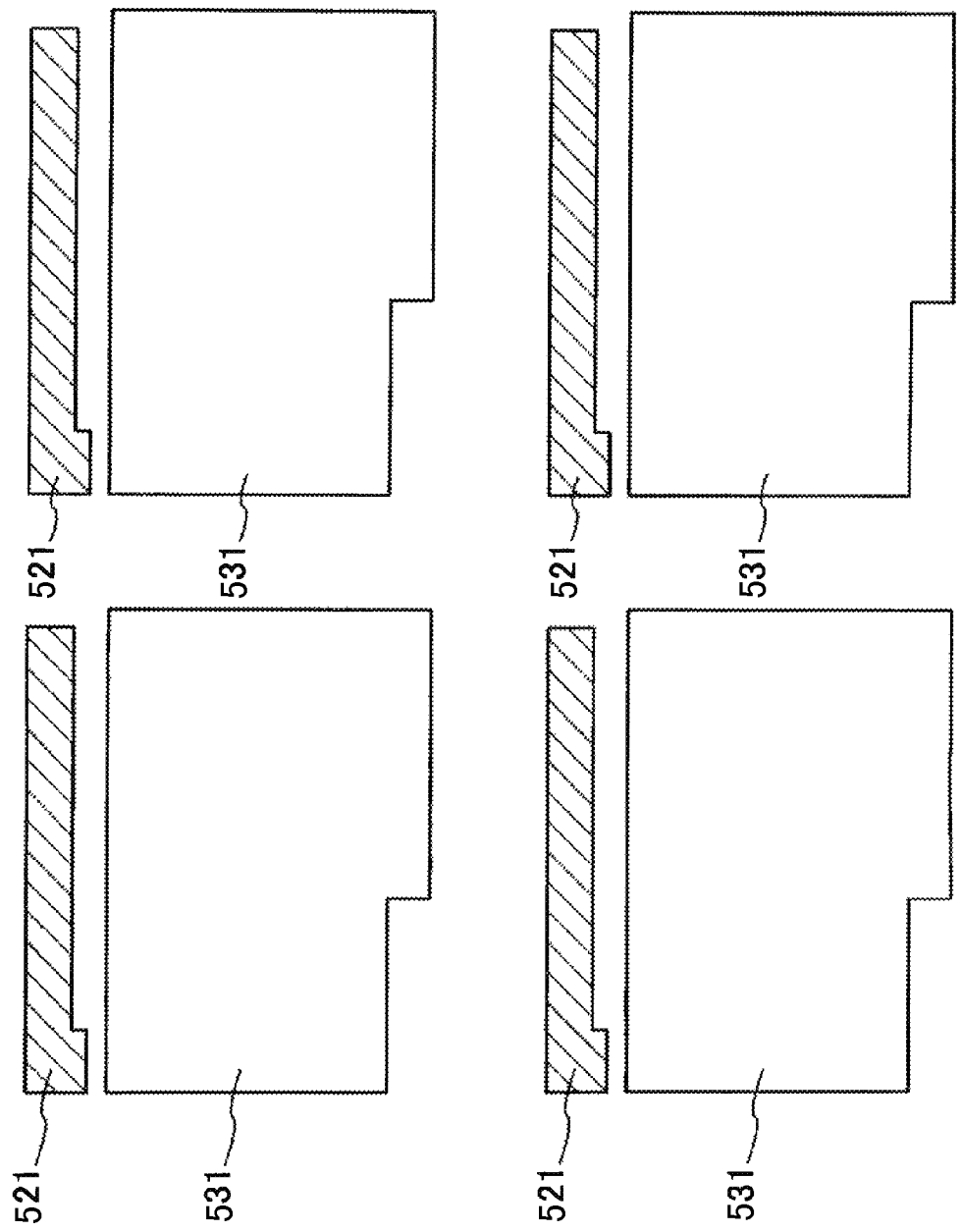
FIG. 20 is a plan view of a pixel circuit of a display device in a second embodiment according to the second aspect of the invention.

FIG. 20 illustrates a state in which a LIPS layer 521 and an electrode layer 531 are formed on the same insulating layer. Here, the electrode layer 531 may be obtained by disposing the same material as that of the LIPS layer 521 on the same insulating layer, then performing an ion implantation process thereon, and then changing the properties thereof so as to have conductivity, alternatively, the electrode layer 531 may be formed of a material different from that of the LIPS layer 521, and being separately formed from the LIPS layer 521.

Figure 21:
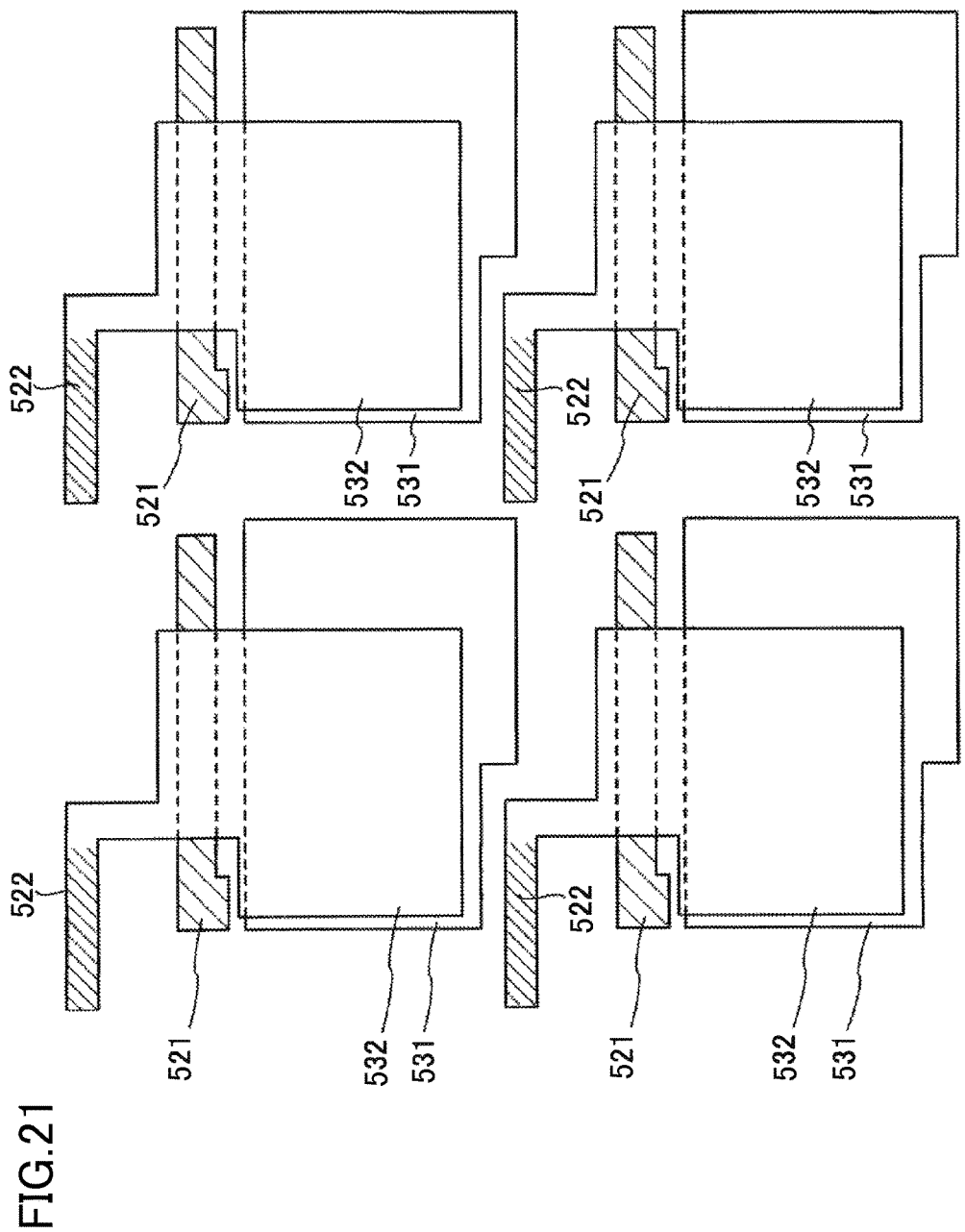
FIG. 21 is a plan view of the pixel circuit of the display device in the second embodiment according to the second aspect of the invention.

FIG. 21 illustrates a state in which an insulating layer is formed on the LIPS layer 521 and the electrode layer 531 which are formed in FIG. 20, and an oxide semiconductor layer 522 and an electrode layer 532 are formed on the insulating layer. First, the oxide semiconductor layer 522 is disposed such that a portion thereof overlaps the LIPS layer 521 and the second electrode layer. The electrode layer 532 is formed by disposing the oxide semiconductor layer 522, then performing an ion implantation process or the like thereon by removing at least a portion corresponding to the channel semiconductor layer of the TFT2, and changing the properties thereof so as to have the conductivity. A portion in which the electrode layer 532 and the LIPS layer 521 overlap with each other corresponds to the gate electrode of the TFT1. In addition, a portion in which the electrode layer 532 and the electrode layer 531 overlap with each other with the insulating layer interposed therebetween corresponds to a portion of the capacitor C.

Figure 22:
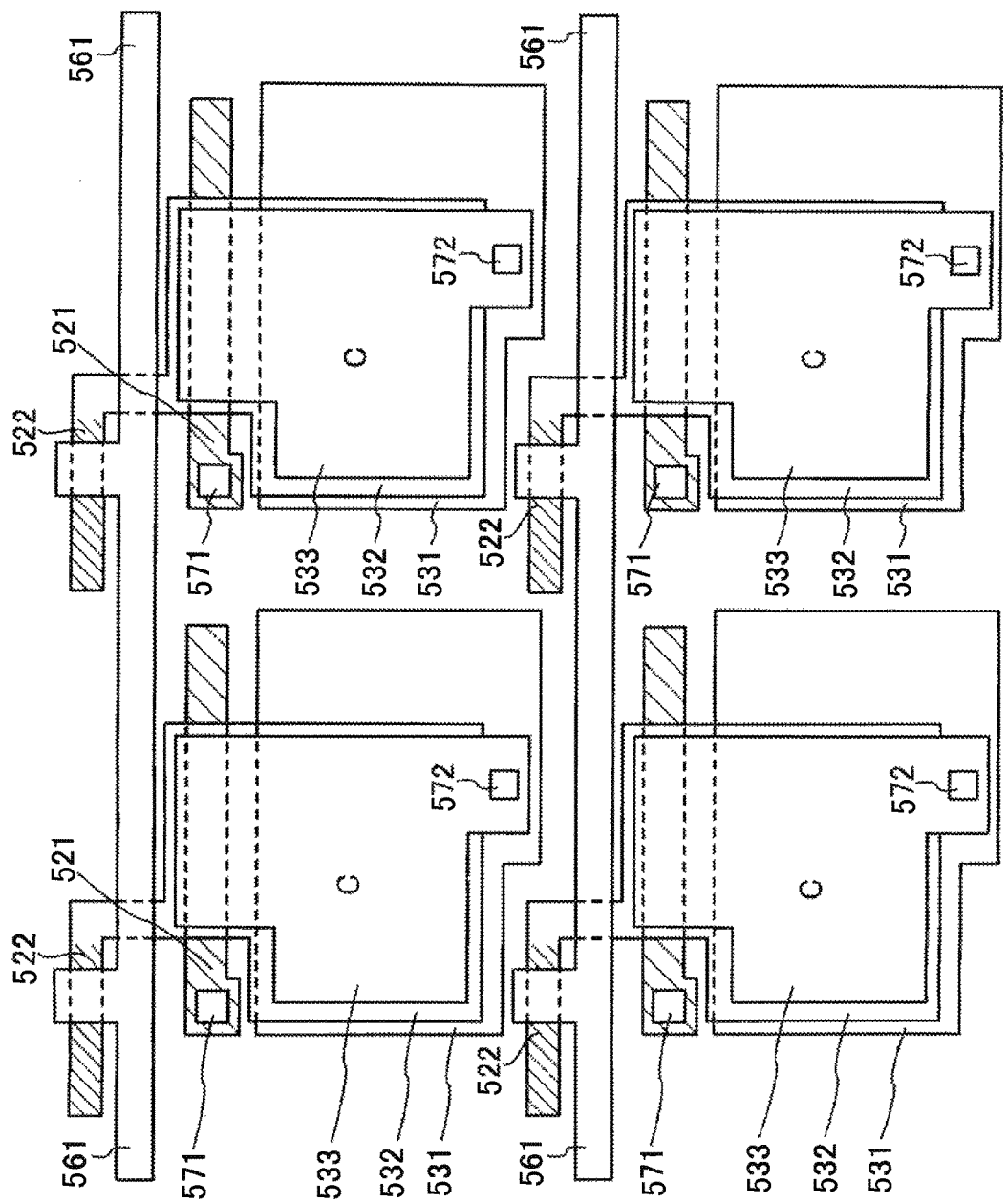
FIG. 22 is a plan view of the pixel circuit of the display device in the second embodiment according to the second aspect of the invention.

FIG. 22 illustrates a state in which an insulating layer is formed on the oxide semiconductor layer 522 and electrode layer 532 which are formed in FIG. 21, and a gate line 561 and an electrode layer 533 are disposed on the insulating layer. The gate line 561 is lineally formed in the horizontal direction, and an area in which a portion which is extended in the vertical direction from the gate line 561 and the oxide semiconductor layer 522 overlap with each other is formed. The electrode layer 533 is formed on and electrically connected to an area, of which a portion overlaps the electrode layer 531 but does not overlap the electrode layer 532, through a via 572 which is formed on the area. Other areas of the electrode layer 533 except for the above area are formed on an area which substantially overlaps the electrode layer 532. The area in which the electrode layer 531 and the electrode layer 532 overlap with each other with the insulating layer interposed therebetween, and the area in which the electrode layer 532 and the electrode layer 533 overlap with each other with the insulating layer interposed therebetween constitute the capacitor C.

Figure 23:
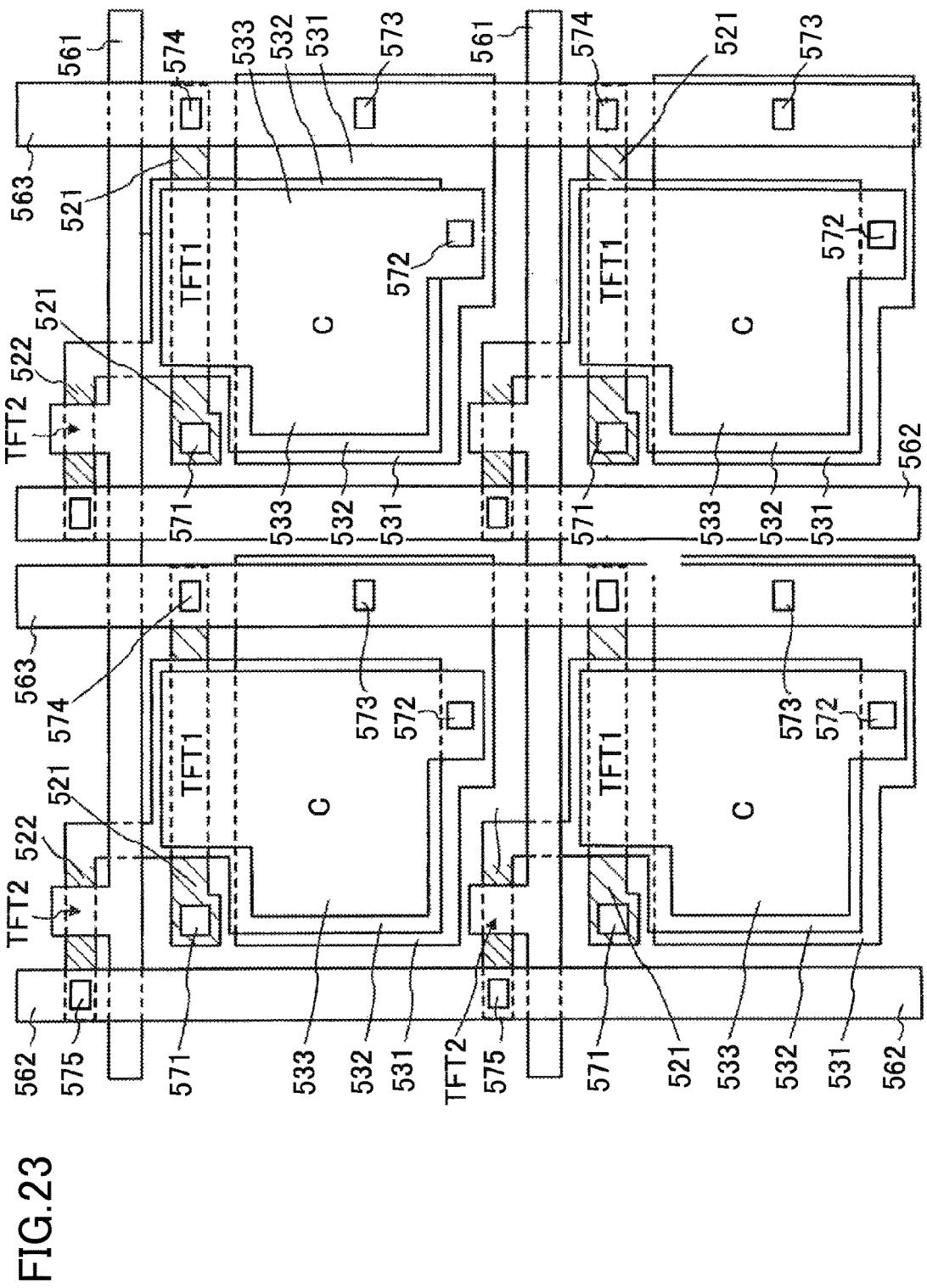
FIG. 23 is a plan view of the pixel circuit of the display device in the second embodiment according to the second aspect of the invention.

FIG. 23 is a diagram illustrating a state in which an insulating layer is formed on the gate line 561 and the third electrode layer 533 which are formed in FIG. 22, and the signal line 562 and the power line 563 are disposed on the insulating layer. The LTPS layer 521 and the power line 563 are electrically connected to each other through the via 574 which is formed in an area in which the LIPS layer 521 and the power line 563 overlap with each other. In addition, the anode contact hole 571 is formed on the LIPS layer 521. The oxide semiconductor layer 522 and the signal line 562 are electrically connected to each other through the via 575 which is formed in an area in which the oxide semiconductor layer 522 and the signal line 562 overlap with each other. The electrode layer 531 and the power line 563 are electrically connected to each other through the via 573 which is formed in an area in which the electrode layer 531 and the power line 563 overlap with each other.

Figure 24:
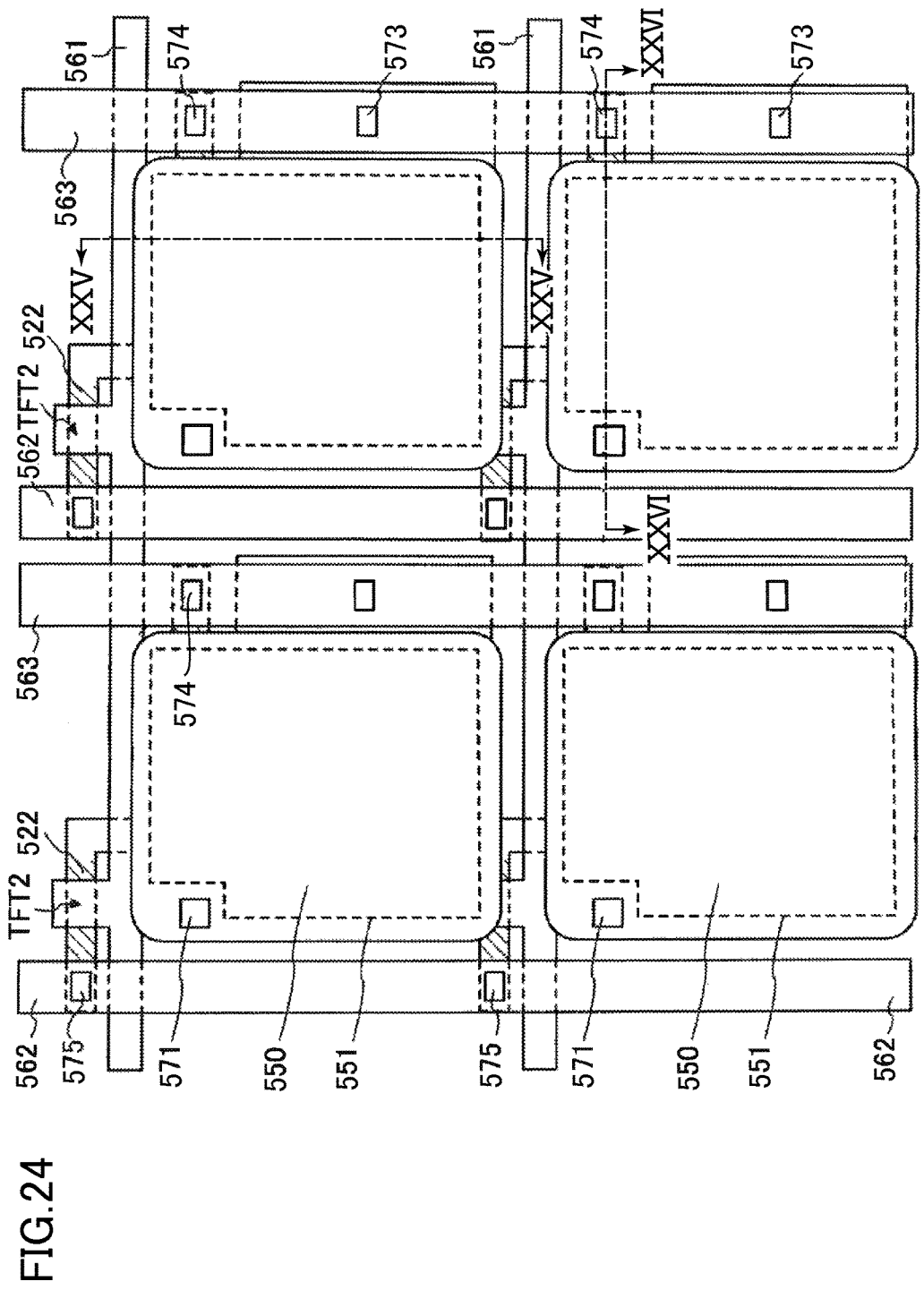
FIG. 24 is a plan view of the pixel circuit of the display device in the second embodiment according to the second aspect of the invention.

FIG. 24 is a plan view illustrating a state in which a planarization layer is formed on the signal line 562 and the power line 563 which are formed in FIG. 23, and then the anode 550 is formed on the planarization layer. The anode 550 is formed in a pixel area which is vertically surrounded by the gate line 561, and horizontally surrounded by the signal line 562 and the power line 563. A bank is formed so as to surround the anode 550 and the anode contact hole 571, and an area which is surrounded by a dotted line 551 is an opening portion.

As described above, also in the second embodiment as in the first embodiment, the TFT2 of which the channel semiconductor layer is the oxide semiconductor is used as a TFT for writing a video signal to a capacitor, and the TFT1 of which the channel semiconductor layer is the LIPS is used as a TFT for supplying a current corresponding to a charge in the capacitor to the LED from the power line, and thus, it is possible to realize a high-quality operation of a high-definition pixel. In addition, the LIPS layer 521 which is manufactured in a relatively high temperature of manufacturing process is firstly formed on the insulating layer positioned below, and thereafter, the oxide semiconductor layer 522 which is manufactured in a relatively low temperature of manufacturing process is firstly formed on the insulating layer positioned above, and therefore, it is possible to prevent a portion which can be formed at a low temperature from being exposed to unnecessary high temperature environment, thereby suppressing the influence by the high temperature.

In addition, in the second embodiment, each of the channel semiconductor layer of the TFT1 and the channel semiconductor layer of the TFT2 are formed on a different insulating layer, and the channel semiconductor layer of the TFT2 corresponds to the gate of the TFT1. With this, a member corresponding to the jumper wiring 564 in the first embodiment is not necessary, and thus it is possible to efficiently use a space in the pixel area.

Further, it is possible to efficiently use a space in the pixel area by forming the capacitor between channel semiconductor layers of the respective TFT1 and TFT2.

Cross-Sectional View

Next, a configuration of the display device according to the second embodiment will be described with reference to FIG. 25 and FIG. 26.

Figure 25:
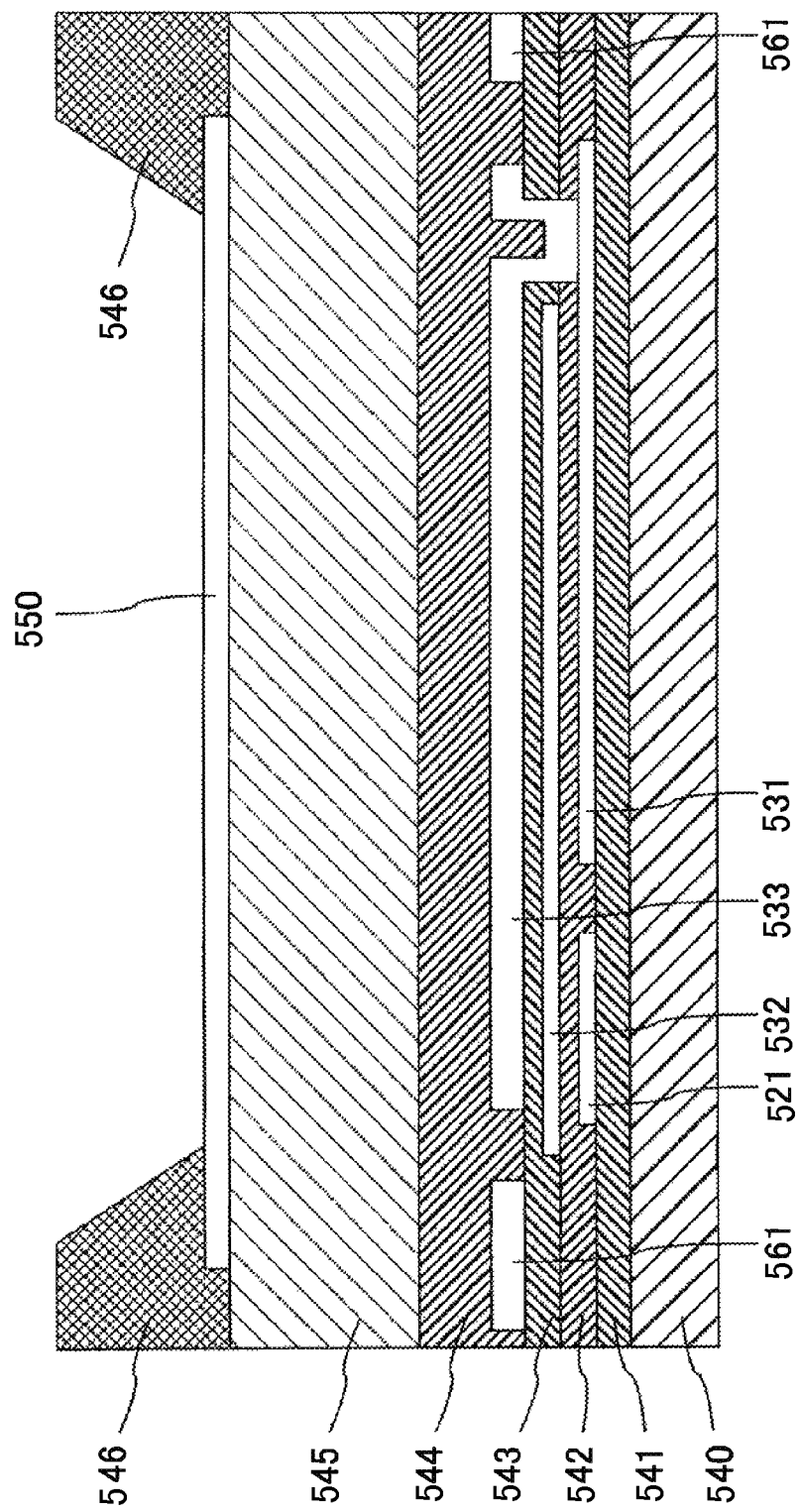
FIG. 25 is a cross-sectional view taken along a line XXV-XXV of a pixel of the display device in FIG. 24.

FIG. 25 is a cross-sectional view taken along a line XXV-XXV of a pixel of the display device shown in FIG. 24. With reference to FIG. 25, an insulating layer 541, an insulating layer 542, an insulating layer 543, an insulating layer 544, and a planarization layer 545 are sequentially laminated on the TFT substrate 540. Here, the TFT substrate 540 is formed of glass, a resin, or the like. In addition, the insulating layer 541 is formed of an undercoat (an inorganic separation membrane) or the like. The insulating layers 542 and 543 are formed of an inorganic material such as a silicon nitride. The insulating layer 544 is formed of an inorganic material such as a silicon oxide. An organic material such as acryl or polyimide is used as the planarization layer 545. The anode 550 is formed on the planarization layer 545. The anode 550 has; for example, a structure in which oxide layers such as In and Zn are laminated on an Ag layer. A bank 546 is formed so as to surround the portions on the anode 550. An organic material such as acryl or polyimide is used as the bank 546.

In addition, when referring to FIG. 25, the respective electrode layers 531, 532, and 533 are formed on the respective insulating layers 541, 542, and 543, and these three layers of electrode layers determine a capacitance. The insulating layer 541 is also provided with the LTPS layer 521 thereon. In addition, the electrode layer 532 is formed on the insulating layer 542, and here, the oxide semiconductor layer 522 is doped with impurities such that the properties are changed so as to have the conductivity. Further, the gate line 561 is formed as well on the insulating layer 543 in addition to the electrode layer 533. The gate line 561 is formed of, for example, a metallic material such as AL and Mo, and the electrode layer 533 may be also formed of the same material as that of the gate line 561.

Figure 26:
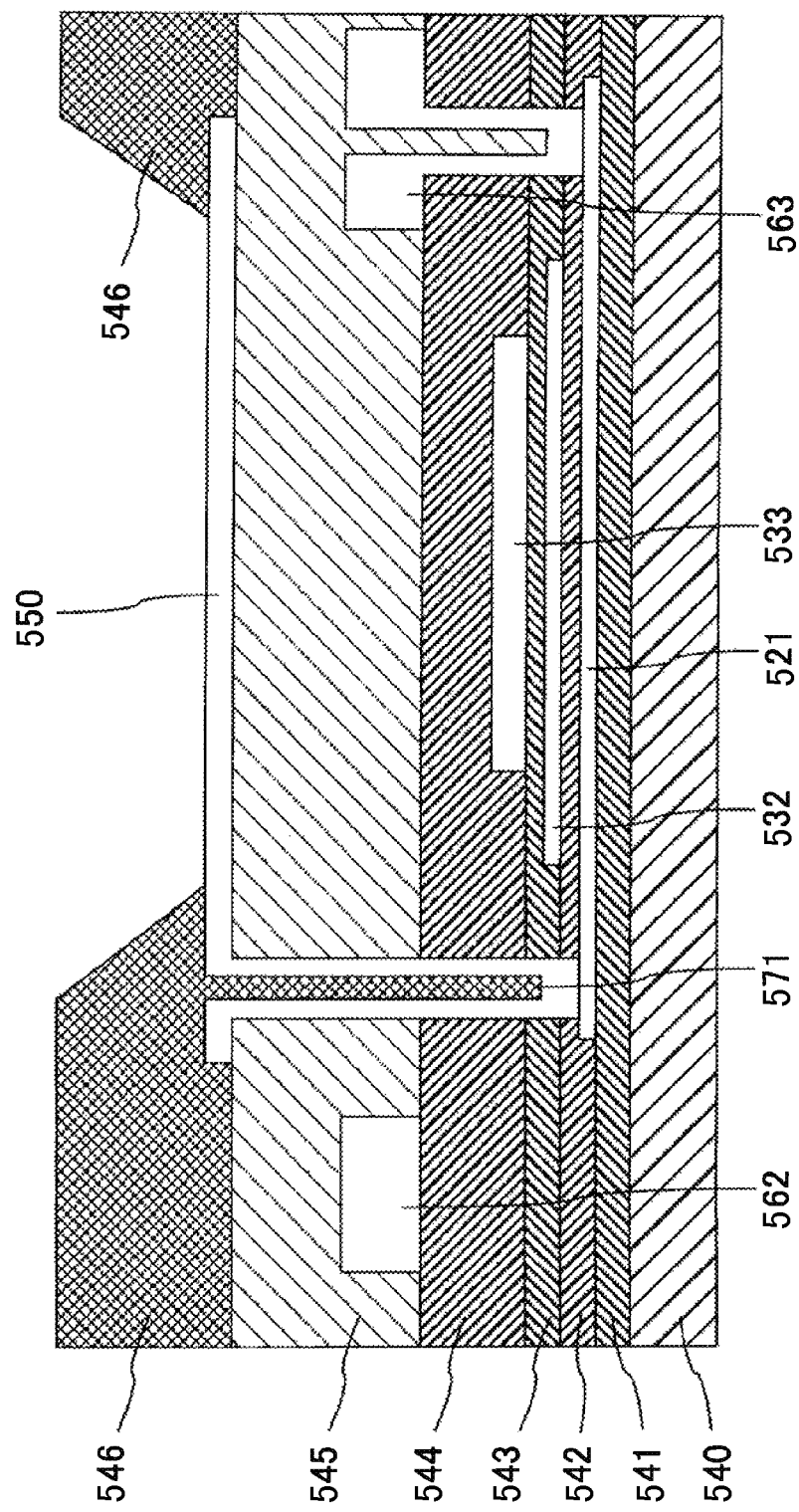
FIG. 26 is a cross-sectional view taken along a line XXVI-XXVI of a pixel of the display device in FIG. 24 according to the second aspect of the invention.

FIG. 26 is a cross-sectional view taken along a line XXVI-XXVI of the pixel of the display device shown in FIG. 24. With reference to FIG. 26, the LIPS layer 521 is formed on the insulating layer 541, and is electrically connected to the anode 550 via the anode contact hole 571. In addition, the power line 563 is formed on and is electrically connected to the insulating layer 544 through the via 574. The insulating layer 544 is also provided with the signal line 552 thereon. The signal line 562 and the power line 563 are formed of, for example, a metallic material such as Ti and Al.

Modification 1

Figure 27:
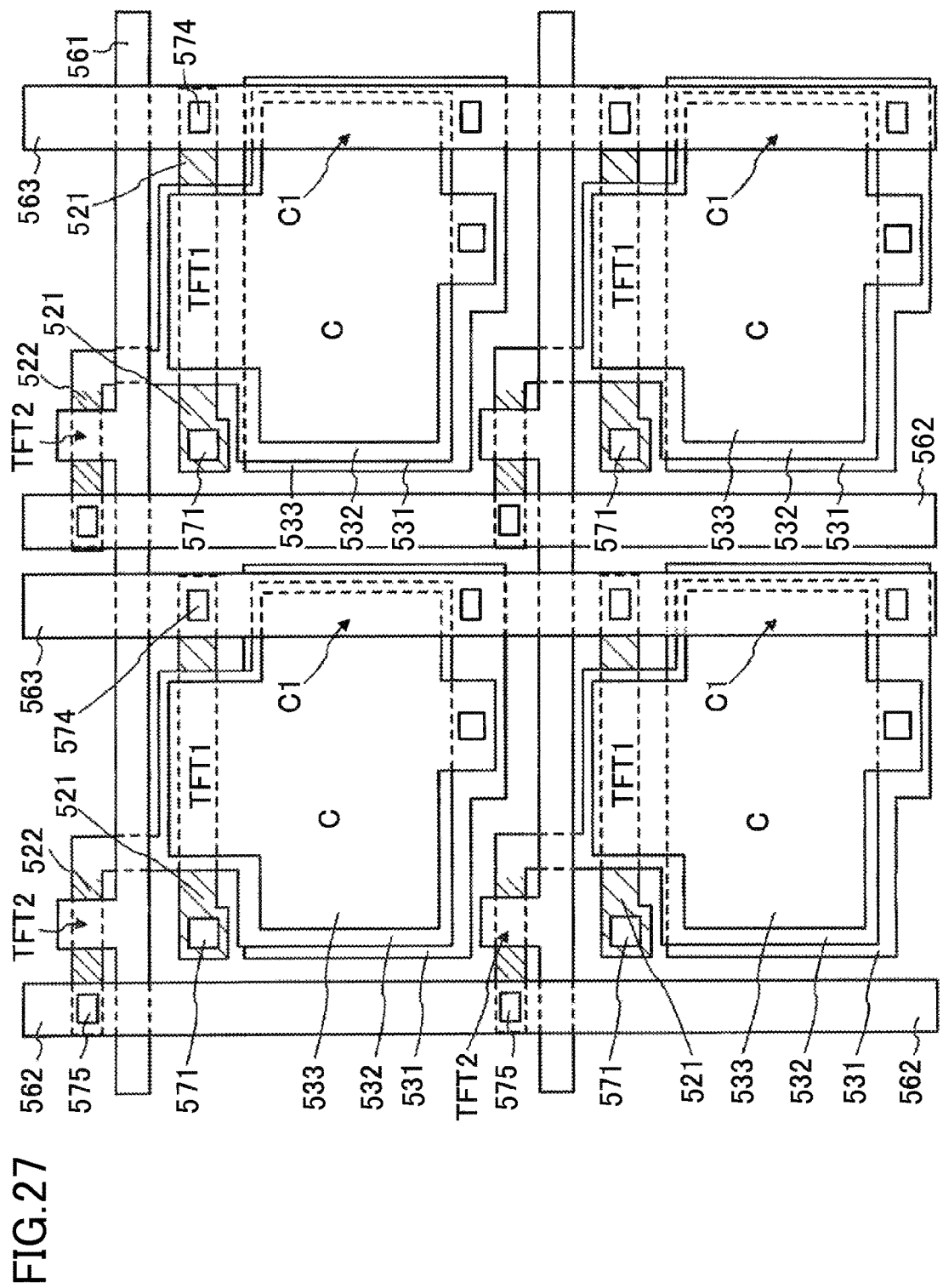
FIG. 27 is a plan view of a pixel circuit of a display device in Modification 1 of the second embodiment according to the second aspect of the invention.

Next, Modification 1 of the second embodiment will be described with reference to FIG. 27. In Modification 1, it is found that the electrode layer 532 and the electrode layer 533 are formed to be extended to an area C1 in which the electrode layer 532 and the electrode layer 533 overlap the power line 563 disposed on the right side of the pixel. In this way, when forming an area, in which the power line 563 and the electrode layers 531, 532, and 533 overlap with each other, on the lower side of the power line 563, it is possible to secure a large area in which the capacitor is formed as compared with the second embodiment. Note that, as an application example of Modification 1, it is possible to form an area in which the electrode layers 531, 532, and 533 overlap the signal line 562 on the left side of the pixel without overlapping the power line 563 on the right side of the pixel.

Modification 2

Figure 28:
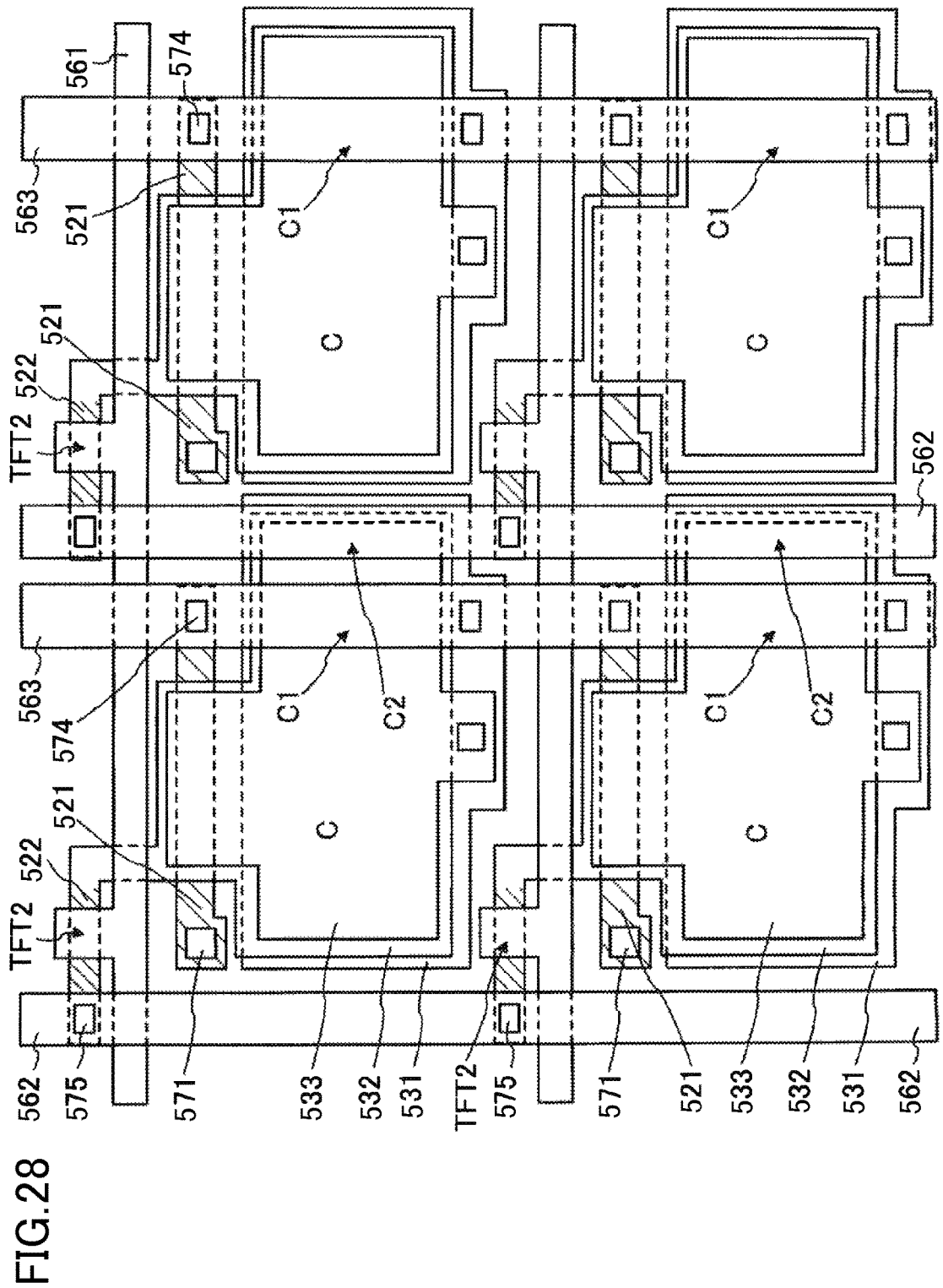
FIG. 28 is a plan view of a pixel circuit of the display device in Modification 2 of the second embodiment according to the second aspect of the invention.

Next, Modification 2 of the second embodiment will be described with reference to FIG. 28. In Modification 2, it is found that an area C2 in which the electrode layers 531, 532, and 533 overlap not only the power line 563 which is disposed on the right side of the pixel but also the signal line 562 which is disposed on the right side of the power line 563 is formed. It is found that it is possible to secure a large area in which the capacitor is formed as compared with Modification 1. Meanwhile, FIG. 27 illustrates an example of forming an area in which the power line 563 and the signal line 562 on the right side of the pixel overlap the electrode layers 531, 532, and 533; however, as an application example of Modification 2, an area in which the electrode layers 531, 532, and 533 overlap each of the signal line 562 on the left side of the pixel and the power line 563 on the left side of the pixel may be formed, or an area in which the electrode layers 531, 532, and 533 overlap each of the signal line 562 on the left side of the pixel and the power line 563 on the right side of the pixel may be formed.

Third Embodiment

Figure 29:
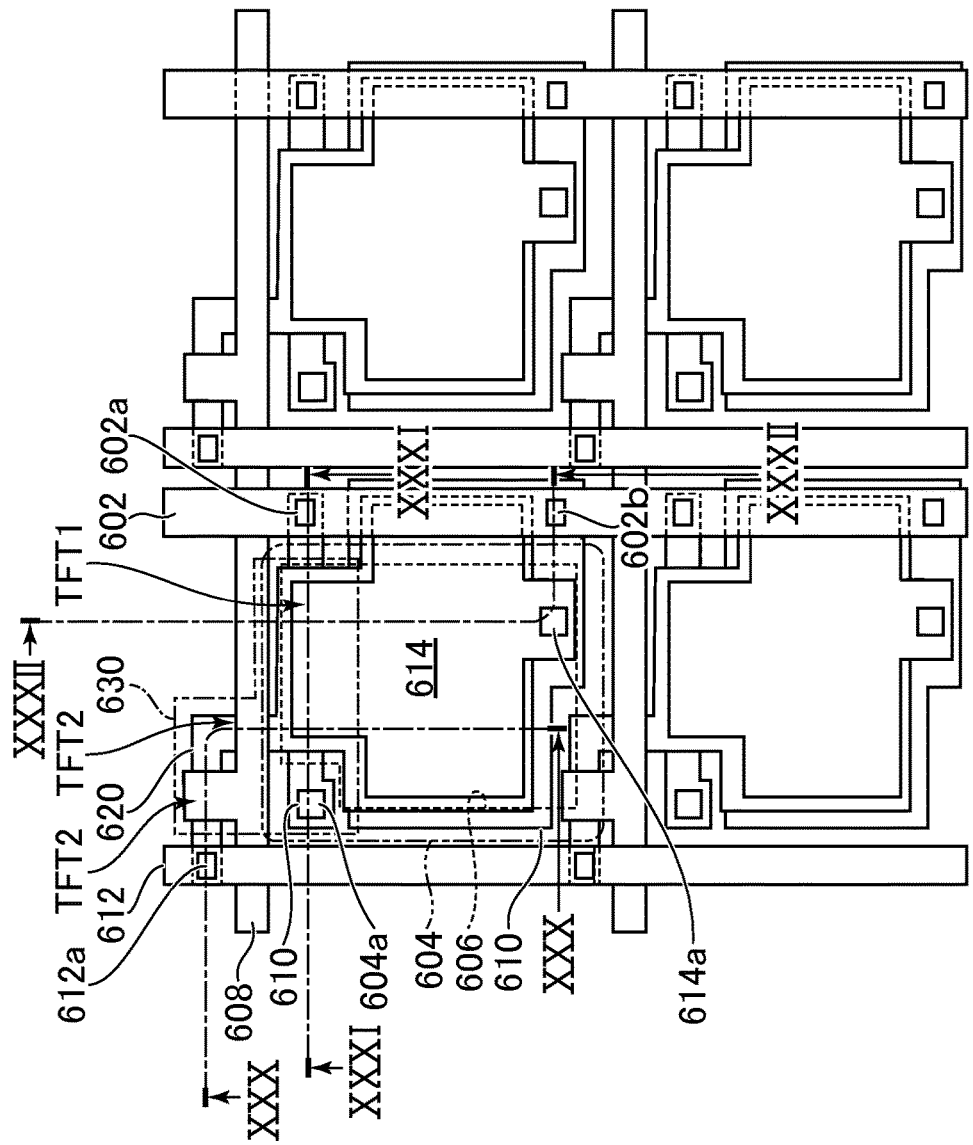
FIG. 29 is a plan view of a pixel circuit of a display device in a third embodiment according to the second aspect of the invention.
Figure 30:
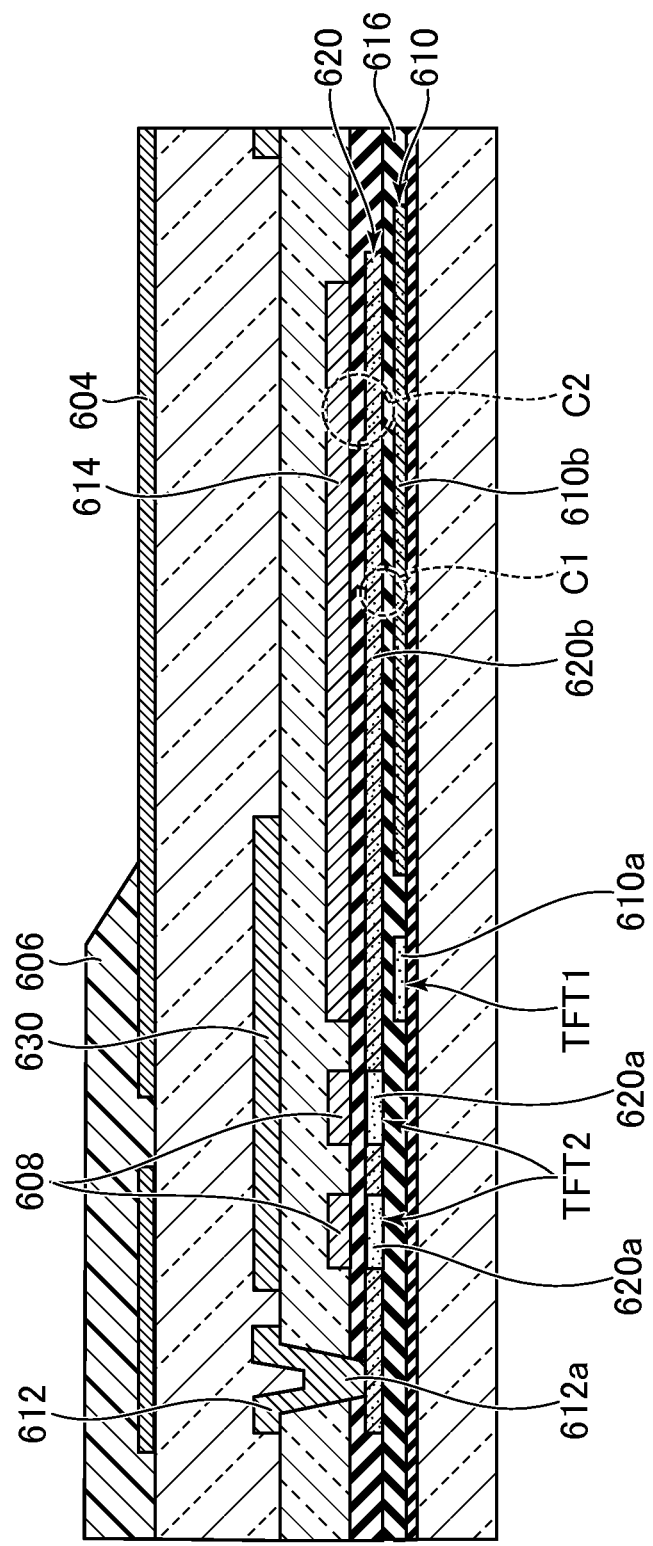
FIG. 30 is a cross-sectional view taken along a line of XXX-XXX of the pixel circuit shown in FIG. 29.
Figure 31:
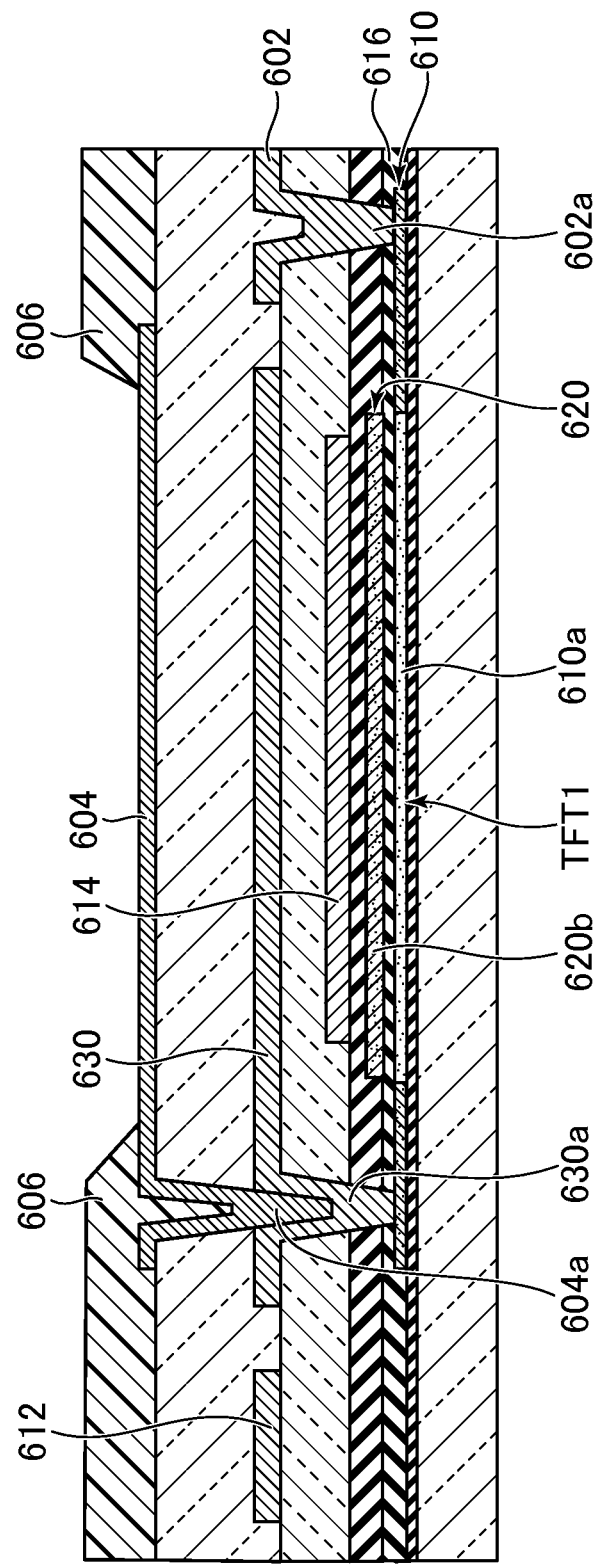
FIG. 31 is a cross-sectional view taken along a line XXXI-XXXI of the pixel circuit shown in FIG. 29.
Figure 32:
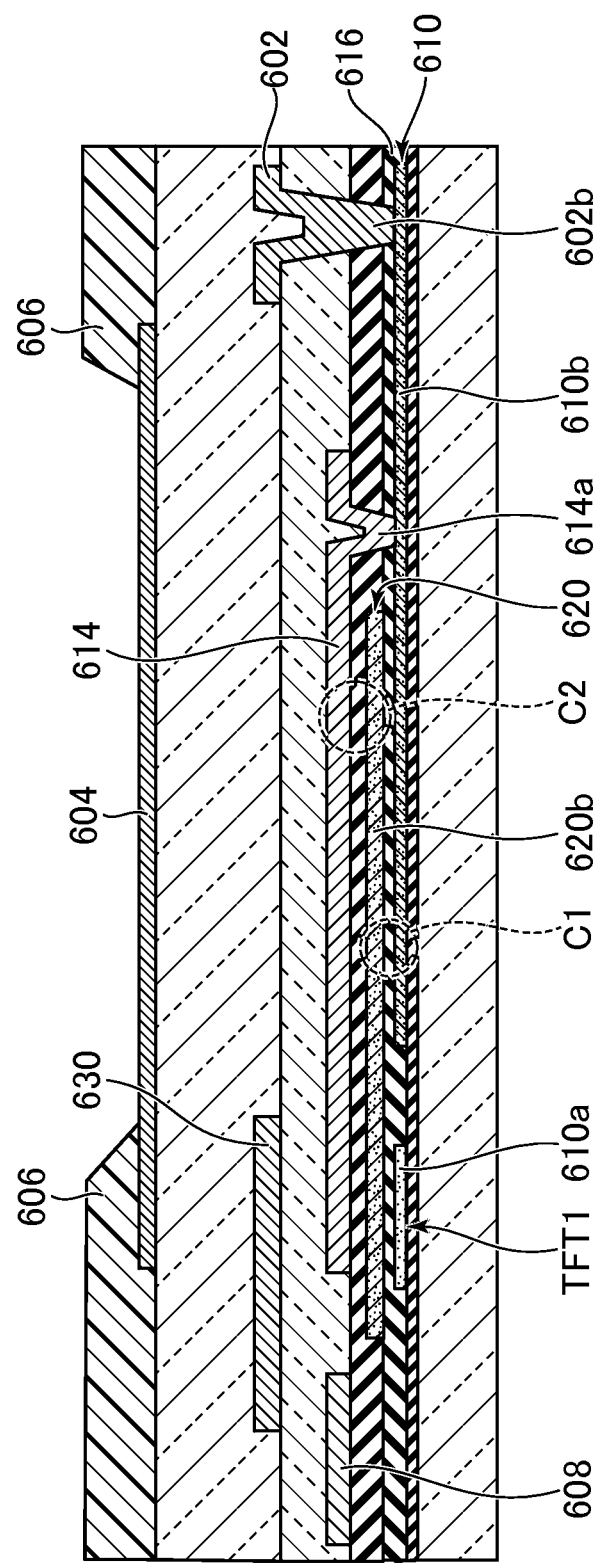
FIG. 32 is a cross-sectional view taken along a line XXXII-XXXII of the pixel circuit shown in FIG. 29.

FIG. 29 is a plan view of a pixel circuit of a display device in the third embodiment according to the second aspect of the invention. FIG. 30 is a cross-sectional view taken along a line XXX-XXX of the pixel circuit shown in FIG. 29. FIG. 31 is a cross-sectional view taken along a line XXXI-XXXI of the pixel circuit shown in FIG. 29. FIG. 32 is a cross-sectional view taken along a line XXXII-XXXII of the pixel circuit shown in FIG. 29. Meanwhile, the pixel circuit shown in FIG. 15 is also applicable to the third embodiment.

The display device according to the third embodiment includes at least two thin film transistors (the first transistor TFT1 and the second transistor TFT2), which are a type of a field effect transistor, on each pixel.

A channel semiconductor layer 610a of the first transistor TFT1 is a portion of a first layer 610. The first layer 610 is formed of polycrystalline silicon of which at least one portion is doped with impurities. Since the polycrystalline silicon is used, the first transistor TFT1 is excellent in the current driving performance. The first transistor TFT1 controls the current between a power line 602 and an anode 604. That is, one of the sources and the drain of the first transistor TFT1 is connected to the power line 602 in the contact portion 602a, and the other one of the source and the drain of the first transistor TFT1 is connected to an anode 604 in contact portions 604a and 630a. Note that, the anode 604 has an end portion which is covered by a bank 606.

The first layer 610 is separated from the channel semiconductor layer 610a of the first transistor TFT1, and includes a conductive layer 610b which has high conductivity compared with the channel semiconductor layer 610a of the first transistor TFT1. The conductivity is adjusted by the amount of doping impurities. The conductive layer 610b is connected to the power line 602 in a contact portion 602b.

A channel semiconductor layer 620a of the second transistor TFT2 is a portion of a second layer 620. The second layer 620 is formed of an oxide semiconductor of which at least a portion is doped with impurities. Since the oxide semiconductor is used, the second transistor TFT2 is excellent in the low leakage properties. The second transistor TFT2 includes two gate electrodes (top gates) which are formed of a portion of a gate line 608 through which a scanning signal is input. The gate line 608 is formed of metal. The second transistor TFT2 is controlled by the scanning signal.

The second layer 620 includes a conductive layer 620b which has high conductivity compared with the channel semiconductor layer 620a of the second transistor TFT2. The second layer 620 continuously includes the channel semiconductor layer 620a and the conductive layer 620b. A portion of the conductive layer 620b which is included in the second layer 620 is the gate electrode (the top gate) with respect to the channel semiconductor layer 610a of the first transistor TFT1. The second layer 620 is connected to a signal line 612 through which a video signal is input in a contact portion 612a, and the first transistor TFT1 is controlled by the video signal which is switched in the second transistor TFT2.

As illustrated in FIG. 30, the other portion of the conductive layer 620b which is included in the second layer 620 and the conductive layer 610b which is included in the first layer 610 by being separated from the first transistor TFT1 overlap with each other, and a capacitance C1 is formed between the other portion of the conductive layer 620b and the conductive layer 610b. In addition, a metal layer 614 which is connected to the conductive layer 610b of the first layer 610 in a contact portion 614a overlaps above the conductive layer 620b of the second layer 620, and a capacitance C2 is formed therebetween.

At least one layer of insulating layer 616 is interposed between the first layer 610 and the second layer 620. That is, the first layer 610 and the second layer 620 are positioned in a different layer. The description for other insulating layers is the same as described in the above-described embodiment.

A light shielding layer 630 is provided so as to cover at least one (both in this example) of channel semiconductor layers 610a and 620a of the first transistor TFT1 and the second transistor TFT2. Since the oxide semiconductor which is a main raw material of the channel semiconductor layer 620a of the second transistor TFT2 is transparent, and absorbs ultraviolet rays, it is preferable to provide the light shielding layer 630. In addition, it is preferable that a thin film transistor which is positioned below or in the vicinity of the light emitting layer (not shown) which emits blue light having a wave length close to ultraviolet rays is shielded from the light through the light shielding layer 630. Alternatively, if white light is emitted from the entirety of pixels, it is preferable that the thin film transistor in the entirety of pixels is covered with the light shielding layer 630.

The light shielding layer 630 is the source or the drain of the first transistor TFT1, and is connected to the side opposite to the side to which the power line 602 is connected. Since the contact portion 604a of the anode 604 is provided so as to overlap the contact portion 630a of the light shielding layer 630, the anode 604 is connected to the power line 602 via the first transistor TFT1. The description for other contents is the same as described in the above-described embodiment.

Fourth Embodiment

Figure 33:
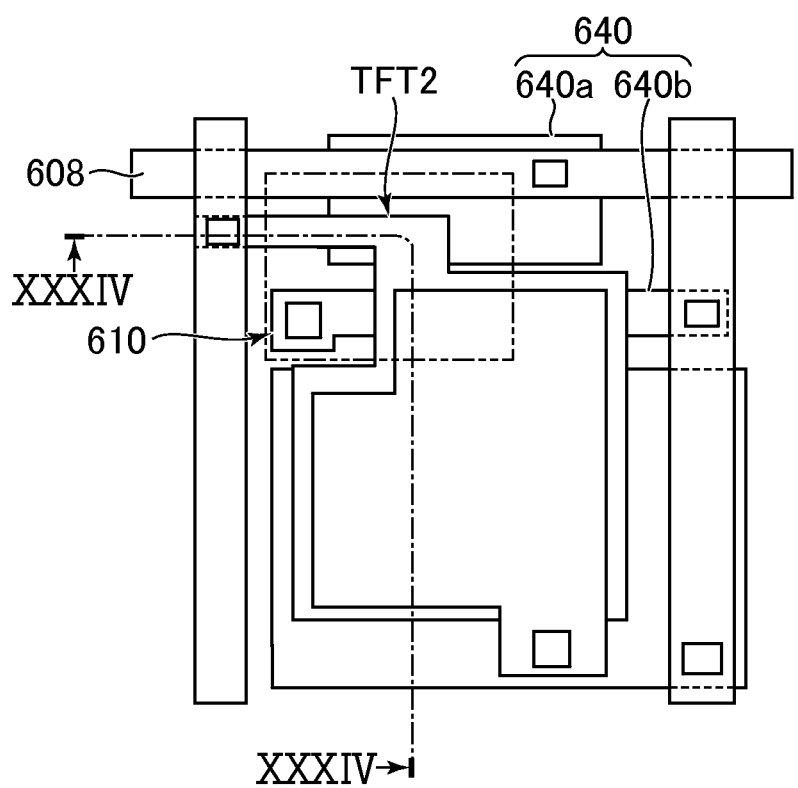
FIG. 33 is a plan view of a pixel circuit of a display device in a fourth embodiment according to the second aspect of the invention.
Figure 34:
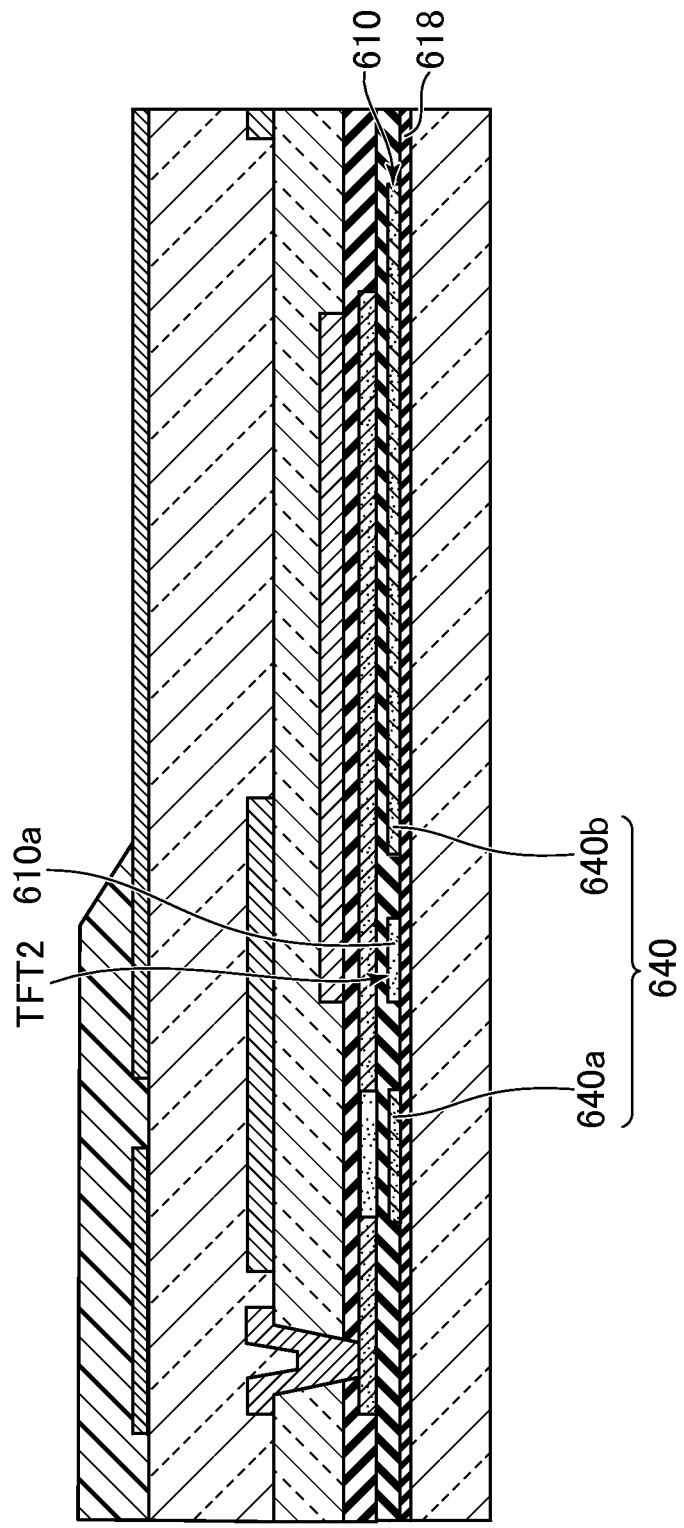
FIG. 34 is a cross-sectional view taken along a line XXXIV-XXXIV of the pixel circuit shown in FIG. 33.

FIG. 33 is a plan view of a pixel circuit of a display device in the fourth embodiment according to the second aspect of the invention. FIG. 34 is a cross-sectional view taken along a line XXXIV-XXXIV of the pixel circuit shown in FIG. 33.

In the fourth embodiment, the first layer 610 includes the channel semiconductor layer 610a for forming the first transistor TFT1, and a conductive layer 640 which is separated from the channel semiconductor layer 610a on the same insulating layer 618 (that is, positioned on the same layer). Further, the conductive layer 640 is divided into a first conductive layer 640a and a second conductive layer 640b.

The first conductive layer 640a is connected to the gate line 608, and corresponds to a gate electrode (a bottom gate) of the second transistor TFT2. The second conductive layer 640b has the same function as that of the conductive layer 610b described in the third embodiment, and thus the description thereof will be omitted. Other contents thereof correspond to the contents described in the third embodiment and other embodiments.

Fifth Embodiment

Figure 35:
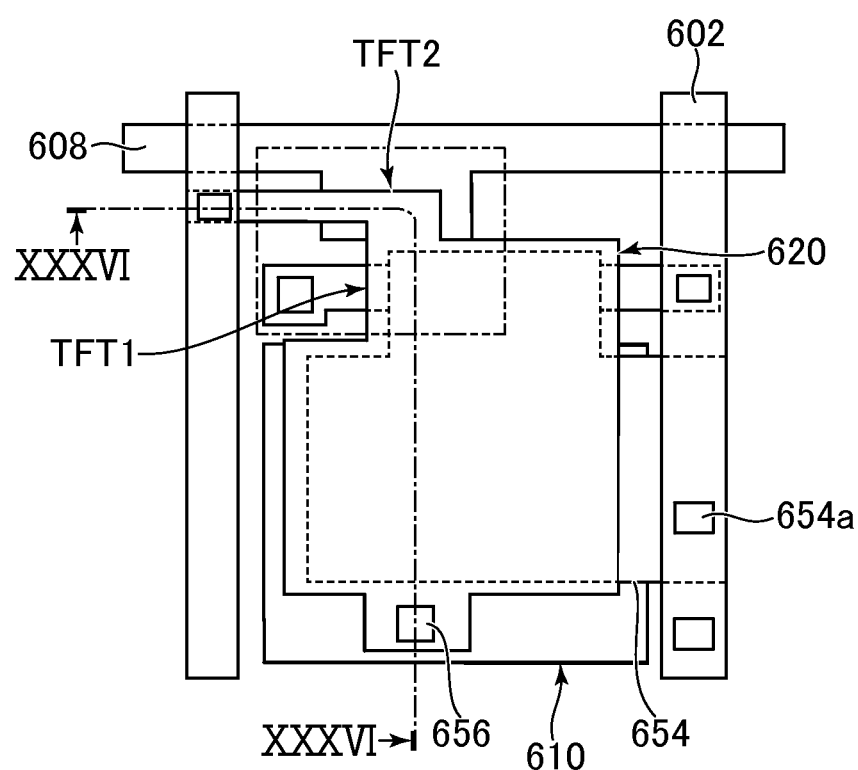
FIG. 35 is a plan view of a pixel circuit of a display device in a fifth embodiment according to the second aspect of the invention.
Figure 36:
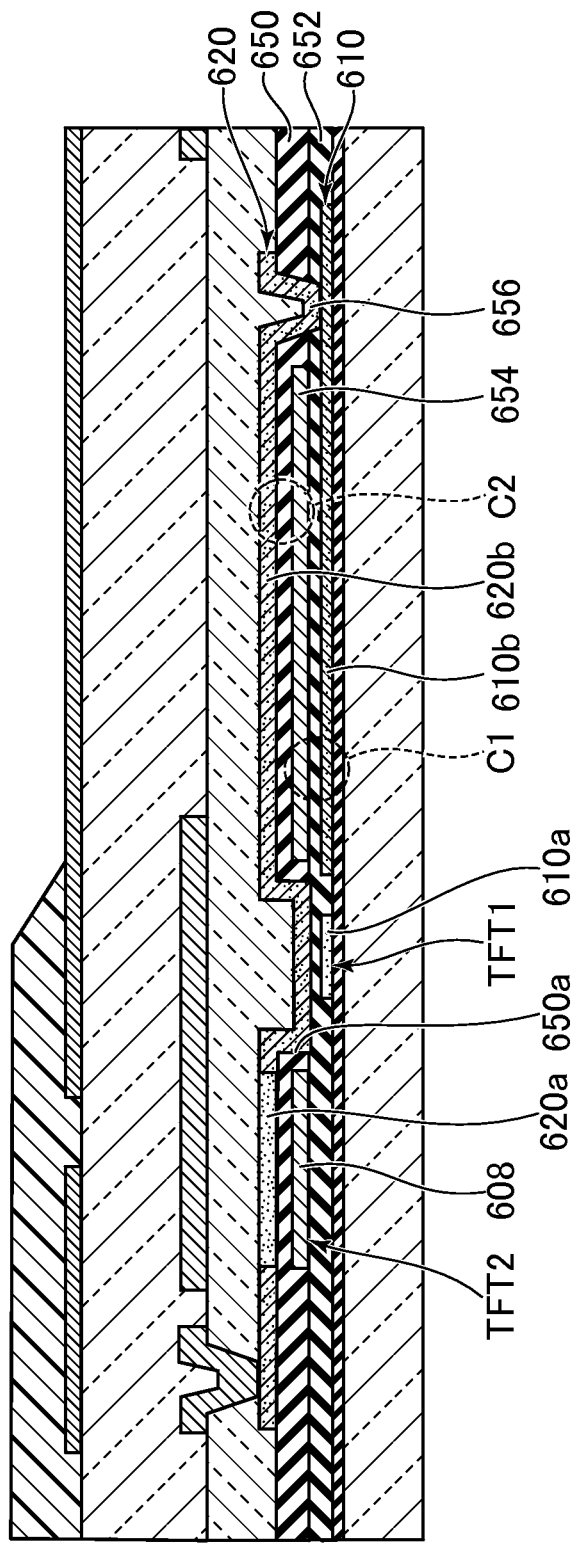
FIG. 36 is a cross-sectional view taken along a line XXXVI-XXXVI of the pixel circuit shown in FIG. 35.

FIG. 35 is a plan view of a pixel circuit of a display device in the fifth embodiment according to the second aspect of the invention. FIG. 36 is a cross-sectional view taken along a line XXXVI-XXXVI of the pixel circuit shown in FIG. 35.

In the fifth embodiment, a portion of the gate line 608 is positioned below the channel semiconductor layer 620a of the second layer 620, and corresponds to the gate electrode (the bottom gate) of the second transistor TFT2.

The conductive layer 610b of the first layer 610, which is separated from the channel semiconductor layer 610a is connected to the conductive layer 620b of the second layer 620. Specifically, the insulating layers 650 and 652 are interposed between the first layer 610 and the second layer 620, and the conductive layer 610b and the conductive layer 620b communicate with each other by the contact portion 656 which passes through the insulating layers 650 and 652.

The metal layer 654 is interposed between the conductive layer 610b and the conductive layer 620b (between the insulating layers 650 and 652) which communicate with each other, and the metal layer 654 is connected to the power line 602 in the contact portion 654a. The capacitance C1 is formed between the conductive layer 610b and the metal layer 654, and the capacitance C2 is formed between the conductive layer 620b and the metal layer 654.

The metal layer 654 is formed so as to avoid above the channel semiconductor layer 610a of the first transistor TFT1. Since two insulating layers 650 and 652 are interposed between the first layer 610 and the second layer 620, a through hole 650a is formed on the insulating layer 650 positioned above, and the conductive layer 620b is placed on the insulating layer 652 positioned below, and thus the conductive layer 620b is positioned above the channel semiconductor layer 610a of the first layer 610, and corresponds to the gate electrode (the top gate) of the first transistor TFT1. Other contents thereof correspond to the contents described in the third embodiment and other embodiments.

Sixth Embodiment

Figure 37:
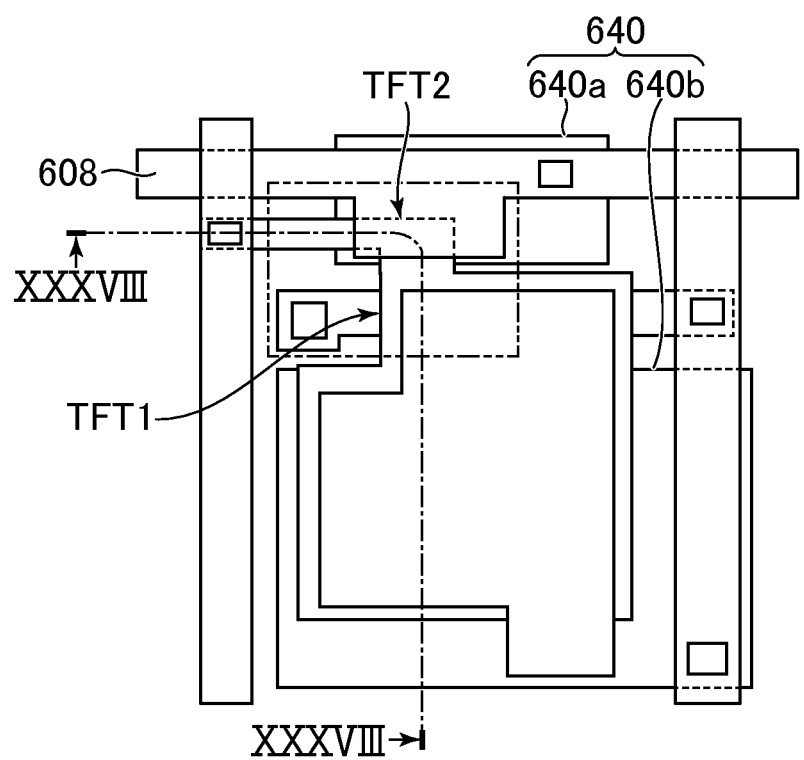
FIG. 37 is a plan view of a pixel circuit of a display device in a sixth embodiment according to the second aspect of the invention.
Figure 38:
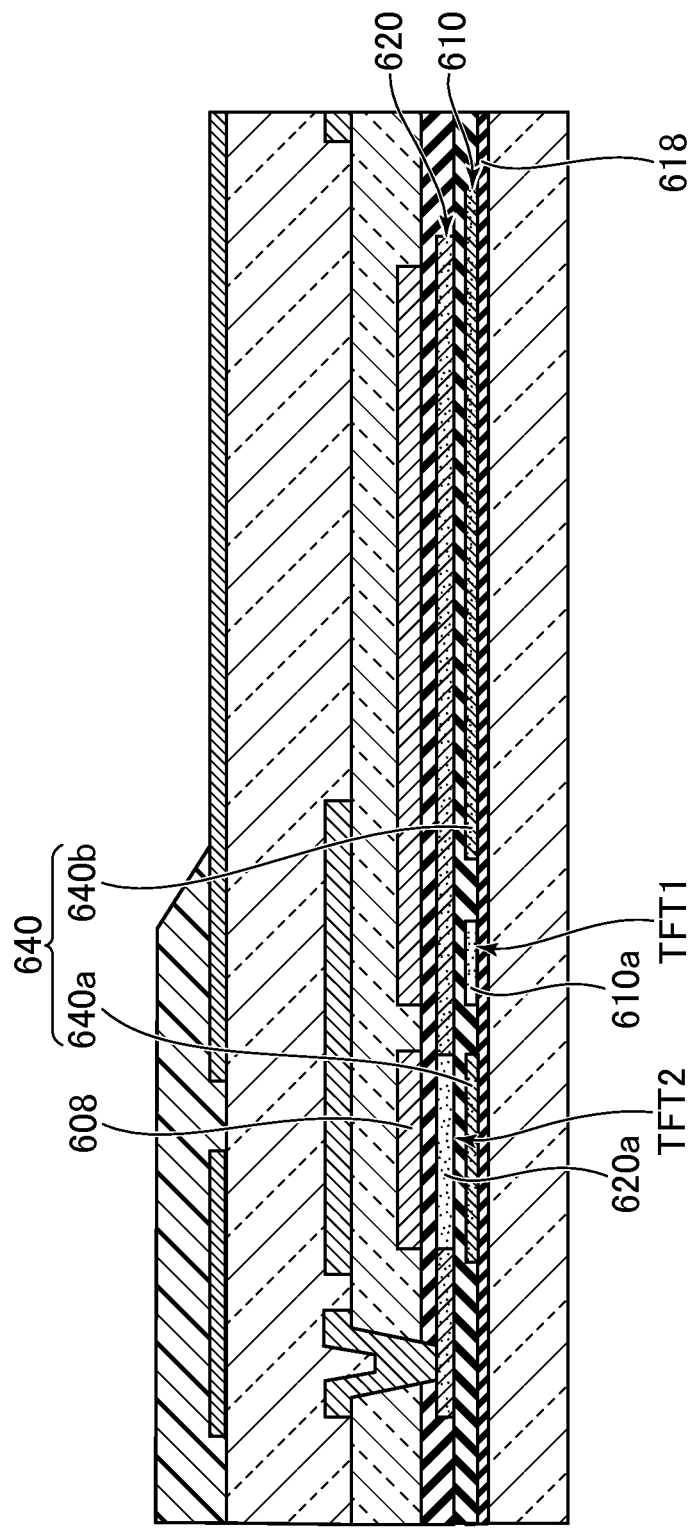
FIG. 38 is a cross-sectional view taken along a line XXXVIII-XXXVIII of the pixel circuit shown in FIG. 37.

FIG. 37 is a plan view of a pixel circuit of a display device in the sixth embodiment according to the second aspect of the invention. FIG. 38 is a cross-sectional view taken along a line XXXVIII-XXXVIII of the pixel circuit shown in FIG. 37.

In the sixth embodiment, the first layer 610 includes the channel semiconductor layer 610a for forming the first transistor TFT1, and the conductive layer 640 which is separated from the channel semiconductor layer 610a on the same insulating layer 618 (that is, positioned on the same layer). Further, the conductive layer 640 is divided into the first conductive layer 640a and the second conductive layer 640b. The first conductive layer 640a is connected to the gate line 608, and corresponds to the gate electrode (the bottom gate) of the second transistor TFT2. Further, a portion of the gate line 608 overlaps above the channel semiconductor layer 620a of the second layer 620, and corresponds to the gate electrode (the top gate) of the second transistor TFT2. The second conductive layer 640b has the same function as that of the conductive layer 610b described in the third embodiment, and thus the description thereof will be omitted. Other contents thereof correspond to the contents described in the third embodiment and other embodiments.

Seventh Embodiment

Figure 39:
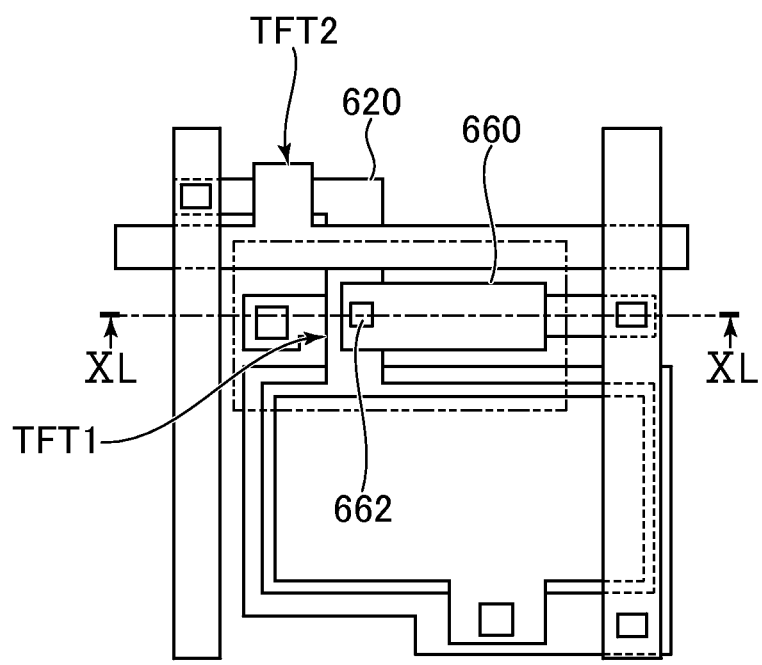
FIG. 39 is a plan view of a pixel circuit of a display device in a seventh embodiment according to the second aspect of the invention.
Figure 40:
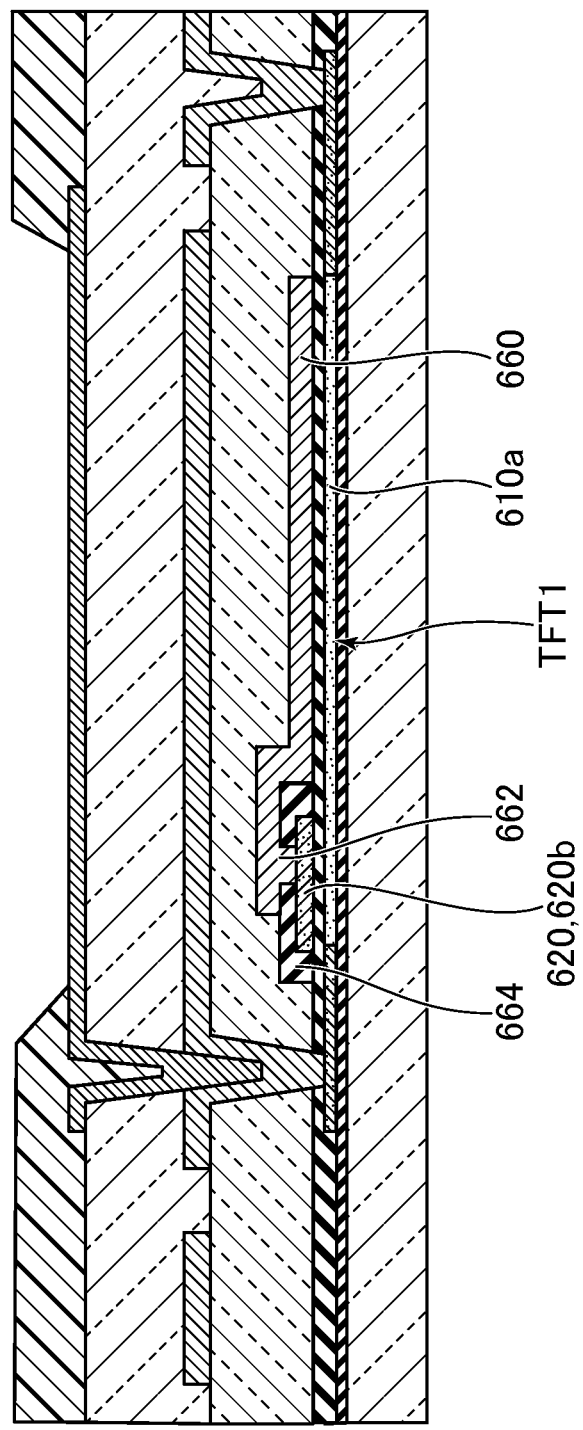
FIG. 40 is a cross-sectional view taken along a line XL-XL of the pixel circuit shown in FIG. 39.

FIG. 39 is a plan view of a pixel circuit of a display device in the seventh embodiment according to the second aspect of the invention. FIG. 40 is a cross-sectional view taken along a line XL-XL of the pixel circuit shown in FIG. 39.

In the seventh embodiment, the conductive layer 620b of the second layer 620 overlaps above the channel semiconductor layer 610a of the first transistor TFT1 and corresponds to the gate electrode (the top gate). In addition, another metal layer 660 which is connected to the conductive layer 620b of the second layer 620 overlaps above the channel semiconductor layer 610a of the first transistor TFT1, and corresponds to the gate electrode (the top gate). That is, two gate electrodes are provided so as to overlap with each other.

In this example, the metal layer 660 extends in one side of length direction (a direction between the source and drain) of the channel semiconductor layer 610a of the first transistor TFT1 from the contact portion 662 through which the metal layer 660 is connected to the conductive layer 620b of the second layer 620. The other end of the metal layer 660 is positioned above the conductive layer 620b of the second layer 620, and thus it is possible to release the electric field effect of the end portion of the gate electrode and to thereby suppress the characteristic fluctuation. With this, it is possible to realize the display device with a high quality and high reliability.

The metal layer 660 and the conductive layer 620b of the second layer 620 are connected to each other via a hole which is formed on the insulating layer 664 interposed between the metal layer 660 and the conductive layer 620b of the second layer 620; however, the insulating layer 664 may be omitted. Other contents thereof correspond to the contents described in the third embodiment and other embodiments.

Eighth Embodiment

Figure 41:
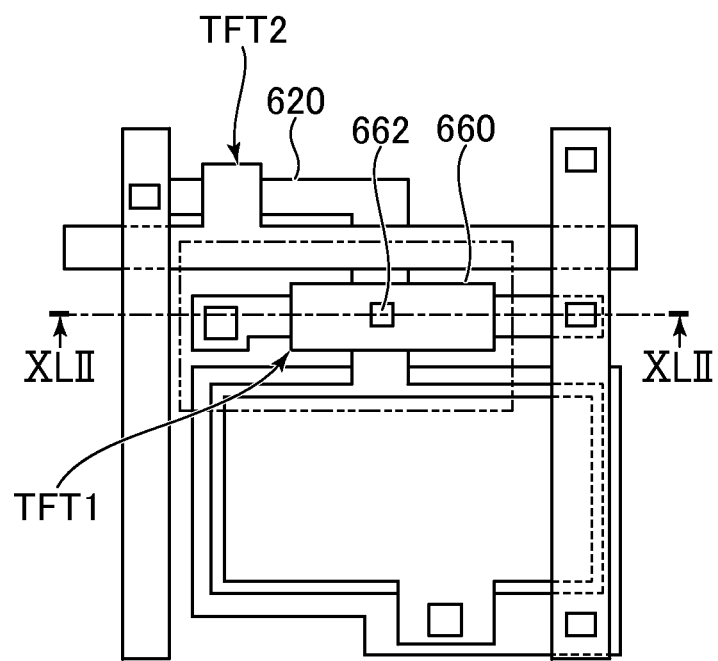
FIG. 41 is a plan view of a pixel circuit of a display device in an eighth embodiment according to the second aspect of the invention.
Figure 42:
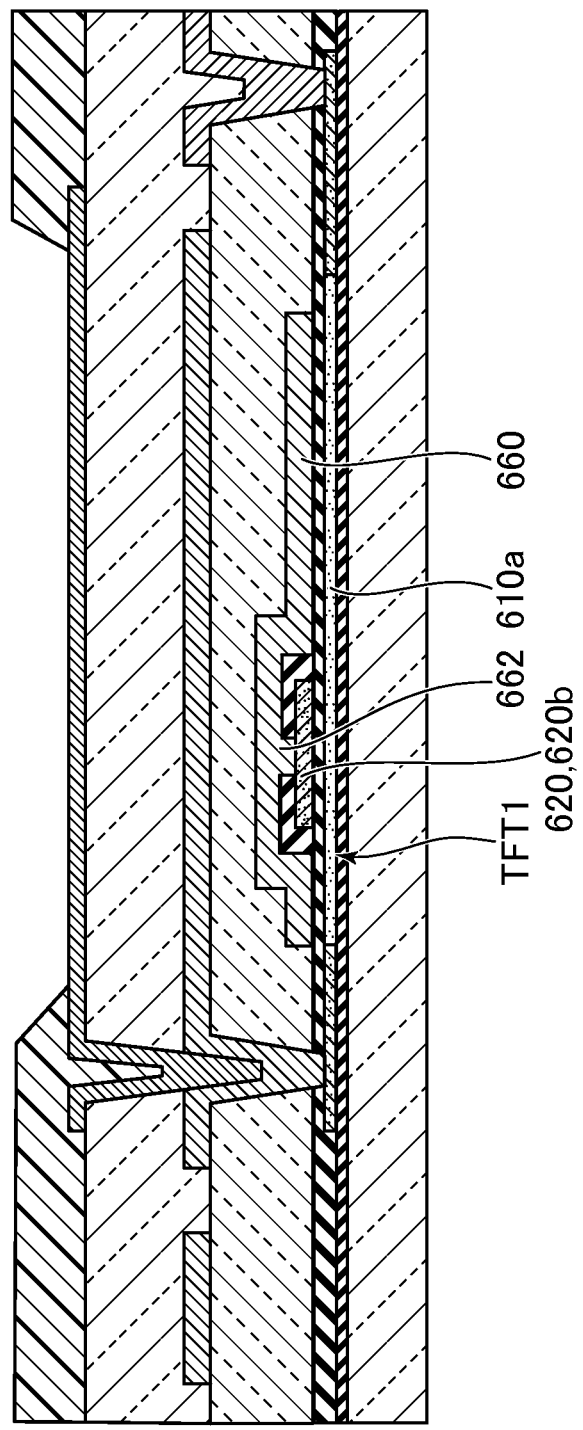
FIG. 42 is a cross-sectional view taken along a line XLII-XLII of the pixel circuit shown in FIG. 41.

FIG. 41 is a plan view of a pixel circuit of a display device in the eighth embodiment according to the second aspect of the invention. FIG. 42 is a cross-sectional view taken along a line XLII-XLII of the pixel circuit shown in FIG. 41.

This example is different from the example in the seventh embodiment in that the metal layer 660 extends in both sides of length direction (a direction between the source and drain) of the channel semiconductor layer 610a of the first transistor TFT1 from the contact portion 662 through which the metal layer 660 is connected to the conductive layer 620b of the second layer 620. The center portion of the metal layer 660 is positioned above the conductive layer 620b of the second layer 620. Other contents thereof correspond to the contents described in the seventh embodiment and other embodiments.

Ninth Embodiment

Figure 43:
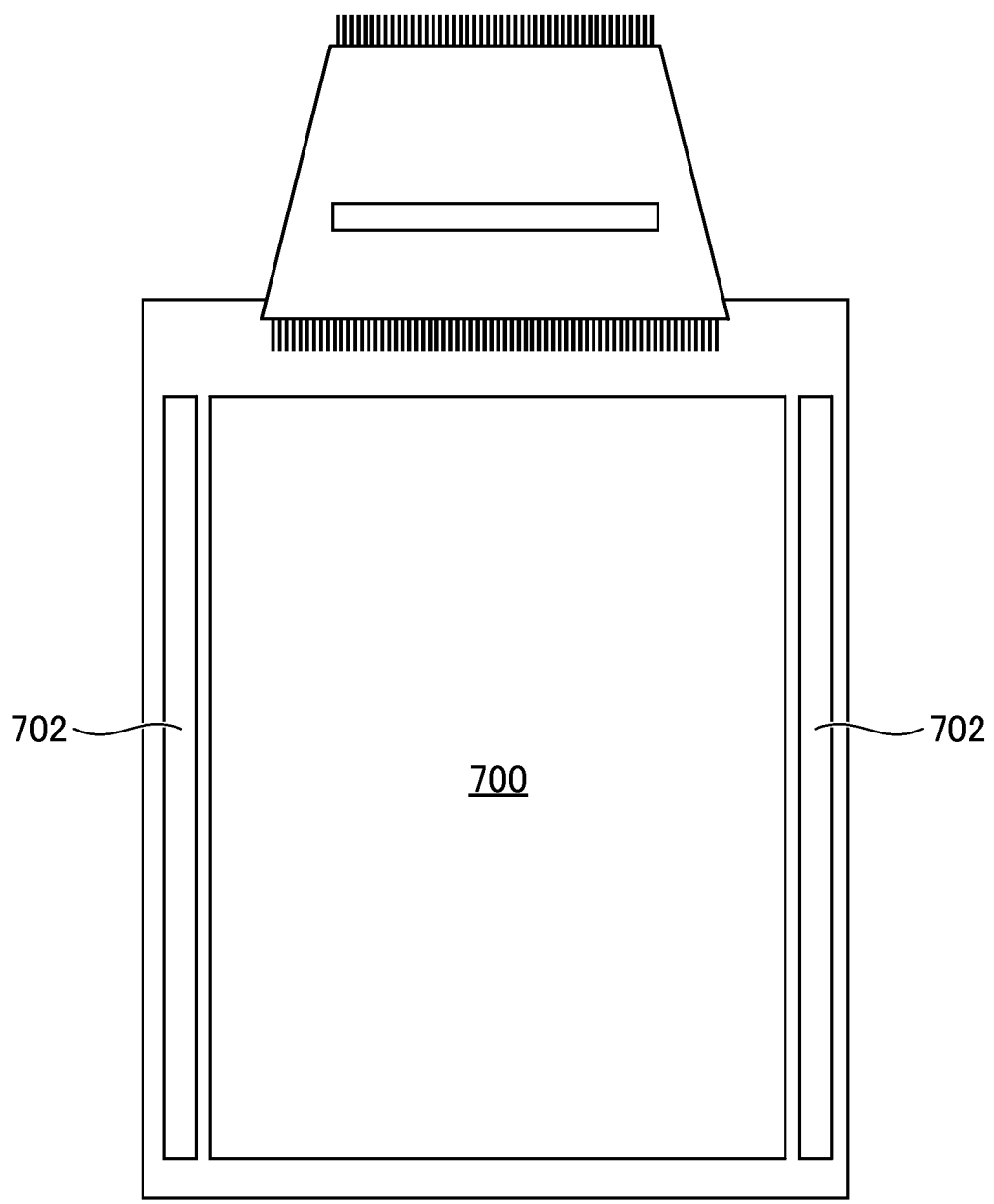
FIG. 43 is a plan view of a pixel circuit of a display device in a ninth embodiment according to the second aspect of the invention.

FIG. 43 is a plan view of a display device in the ninth embodiment according to the second aspect of the invention.

The display device according to the ninth embodiment is provided with a driving circuit 702 (for example, a scanning circuit) in a peripheral area surrounding a display area 700 in which an image is displayed. In the pixel circuit of the display area 700, the channel semiconductor layer of the above-described second transistor TFT2 is formed by using the oxide semiconductor. On the other hand, in the driving circuit 702, the channel semiconductor layer of the transistor is formed by using the polycrystalline silicon. In addition, in the entire display device, the polycrystalline silicon is used for the transistor which requires high driving performance. Although not shown in the drawings, a wiring material of the pixel circuit of the driving circuit 702 may be the same as that of the peripheral area of the display area 700.

Although the oxide semiconductor and the polycrystalline silicon are manufactured at a different process temperature, it is easy to form a transistor as long as the oxide semiconductor is used in the display area 700, and the polycrystalline silicon is used in the peripheral area. For example, it is possible to shorten the process working time by locally performing laser activation.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a plurality of pixels arranged in a matrix, each of the pixels including a first polycrystalline silicon layer, a second polycrystalline silicon layer, a continuous layer, a first electrode, a second electrode, and an organic emitting element, each of the pixels sharing a first insulation layer, a second insulation layer, and a third insulation layer in the plurality of pixels,
   wherein, each of the pixels has a lamination construction including:
   the first polycrystalline silicon layer on the substrate;
   the second polycrystalline silicon layer on the substrate;
   the first insulation layer on the first polycrystalline silicon layer and the second polycrystalline silicon layer;
   the continuous layer on the first insulation layer;

the second insulation layer on the continuous layer;
the first electrode on the second insulation layer;
the second electrode on the second insulation layer;
the third insulation layer on the first electrode and the second electrode; and
the organic emitting element on the third insulation layer,
the continuous layer consists of a compound of an oxide with an indium, a zinc, a tin, or gallium,
each of the pixels includes:
 a first transistor;
 a second transistor connected to the first transistor and the organic emitting element; and
 a capacitor connected to the second transistor,
the continuous layer of each of the pixels has a first plane region, a second plane region, and a third plane region,
the first plane region of the continuous layer is a first channel region of the first transistor,
the second plane region of the continuous layer is a second gate electrode of the second transistor,
the third plane region of the continuous layer is a first capacitor electrode of the capacitor,
a first gate insulation film of the first transistor is made of the second insulation layer and overlaps the first plane region of the continuous layer,
a second gate insulation film of the second transistor is made of the first insulation layer and overlaps the second plane region of the continuous layer,
a first capacitor insulation film of the capacitor is made of the first insulation layer and overlaps the third plane region of the continuous layer,
a first gate electrode of the first transistor is made of the first electrode and overlaps the first plane region of the continuous layer,
a second channel region of the second transistor is made of the first polycrystalline silicon layer and overlaps the second plane region of the continuous layer,
a second capacitor electrode of the capacitor is made of the second polycrystalline silicon layer and overlaps the third plane region of the continuous layer,
a second capacitor insulation film of the capacitor is made of the second insulation layer and overlaps the third plane region of the continuous layer,
a third capacitor electrode of the capacitor is made of the second electrode, is connected to the second capacitor electrode, and overlaps the third plane region of the continuous layer, and
the organic emitting element overlaps the second plane region and the third plane region of the continuous layer.

2. The display device according to claim 1, wherein the lamination construction of each of the pixels further includes:
 a signal line on the third insulation layer;
 a power supply line on the third insulation layer; and
 a fourth insulation layer on the signal line and the power line,
the fourth insulation layer is arranged between the organic emitting element and the signal line,
the power supply line is connected to the first and second polycrystalline silicon layers, and
the signal line is connected to the continuous layer.

3. A display device comprising:
a plurality of pixels arranged in a matrix, each of the pixels including a first polycrystalline silicon layer, a second polycrystalline silicon layer, a continuous layer, a first electrode, a second electrode, and an organic emitting element, each of the pixels sharing a first insulation layer, a second insulation layer, and a third insulation layer in the plurality of pixels,
wherein, each of the pixels has a lamination construction including:
 the first polycrystalline silicon layer on the substrate;
 the second polycrystalline silicon layer on the substrate;
 the first insulation layer on the first polycrystalline silicon layer and the second polycrystalline silicon layer;
 the continuous layer on the first insulation layer;
 the second insulation layer on the continuous layer;
 the first electrode on the second insulation layer;
 the second electrode on the second insulation layer;
 the third insulation layer on the first electrode and the second electrode; and
 the organic emitting element on the third insulation layer,
the continuous layer consists of a compound of an oxide with an indium, a zinc, a tin, or gallium,
each of the pixels includes:
 a first transistor;
 a second transistor connected to the first transistor and the organic emitting element; and
 a capacitor connected to the second transistor,
the second transistor includes the first polycrystalline silicon layer,
the continuous layer of each of the pixels has a first plane region and a second plane region,
the first plane region of the continuous layer is a first channel region of the first transistor,
the second plane region of the continuous layer is a first capacitor electrode of the capacitor,
a first gate insulation film of the first transistor is made of the second insulation layer and overlaps the first plane region of the continuous layer,
a first capacitor insulation film of the capacitor is made of the first insulation layer and overlaps the second plane region of the continuous layer,
a first gate electrode of the first transistor is made of the first electrode and overlaps the first plane region of the continuous layer,
a second capacitor electrode of the capacitor is made of the second polycrystalline silicon layer and overlaps the second plane region of the continuous layer,
a second capacitor insulation film of the capacitor is made of the second insulation layer and overlaps the second plane region of the continuous layer,
a third capacitor electrode of the capacitor is made of the second electrode, is connected to the second capacitor electrode, and overlaps the second plane region of the continuous layer, and
the organic emitting element overlaps the second plane region of the continuous layer.

* * * * *